(12) United States Patent
Yu et al.

(10) Patent No.: US 10,026,671 B2
(45) Date of Patent: Jul. 17, 2018

(54) SUBSTRATE DESIGN FOR SEMICONDUCTOR PACKAGES AND METHOD OF FORMING SAME

(71) Applicant: Taiwan Semiconductor Manufacturing Company, Ltd., Hsin-Chu (TW)

(72) Inventors: Chen-Hua Yu, Hsin-Chu (TW); Mirng-Ji Lii, Sinpu Township (TW); Chien-Hsun Lee, Chu-tung Town (TW); Tsung-Ding Wang, Tainan (TW); Jung Wei Cheng, Hsin-Chu (TW); Ming-Che Liu, Hsin-Chu (TW); Hao-Cheng Hou, Hsin-Chu (TW); Hung-Jen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/473,236

(22) Filed: Aug. 29, 2014

(65) Prior Publication Data
US 2015/0235989 A1 Aug. 20, 2015

Related U.S. Application Data

(63) Continuation-in-part of application No. 14/181,305, filed on Feb. 14, 2014.

(51) Int. Cl.
*H01L 23/367* (2006.01)
*H01L 25/00* (2006.01)
(Continued)

(52) U.S. Cl.
CPC .......... *H01L 23/3675* (2013.01); *H01L 23/13* (2013.01); *H01L 23/36* (2013.01);
(Continued)

(58) Field of Classification Search
CPC . H01L 21/563; H01L 23/055; H01L 25/0553; H01L 22/20; H01L 21/568;
(Continued)

(56) References Cited

U.S. PATENT DOCUMENTS

| 4,728,751 A | 3/1988 | Canestaro et al. |
| 4,811,082 A | 3/1989 | Jacobs et al. |

(Continued)

FOREIGN PATENT DOCUMENTS

| JP | 2008103536 A | 5/2008 |
| JP | 4339309 B2 | 10/2009 |

(Continued)

OTHER PUBLICATIONS

Ranganathan, N., et al., •Integration of High Aspect Ratio Tapered Silicon via for Through-Silicon Interconnection,• 58th Electronic Components and Technology Conference, ECTC 2008., May 2008, pp. 859-865, IEEE, Lake Buena Vista, Florida, United States.

(Continued)

*Primary Examiner* — Mohsen Ahmadi
*Assistant Examiner* — Fang-Xing Jiang
(74) *Attorney, Agent, or Firm* — Slater Matsil, LLP

(57) ABSTRACT

An embodiment device package includes first die and one or more redistribution layers (RDLs) electrically connected to the first die. The one or more RDLs extend laterally past edges of the first die. The device package further includes one or more second dies bonded to a first surface of the one or more RDLs and a connector element on the first surface of the one or more RDLs. The connector element has a vertical dimension greater than the one or more second dies. A package substrate is bonded to the one or more RDLs using the connector element, wherein the one or more second dies is disposed between the first die and the package substrate.

20 Claims, 32 Drawing Sheets

Figure 1C:
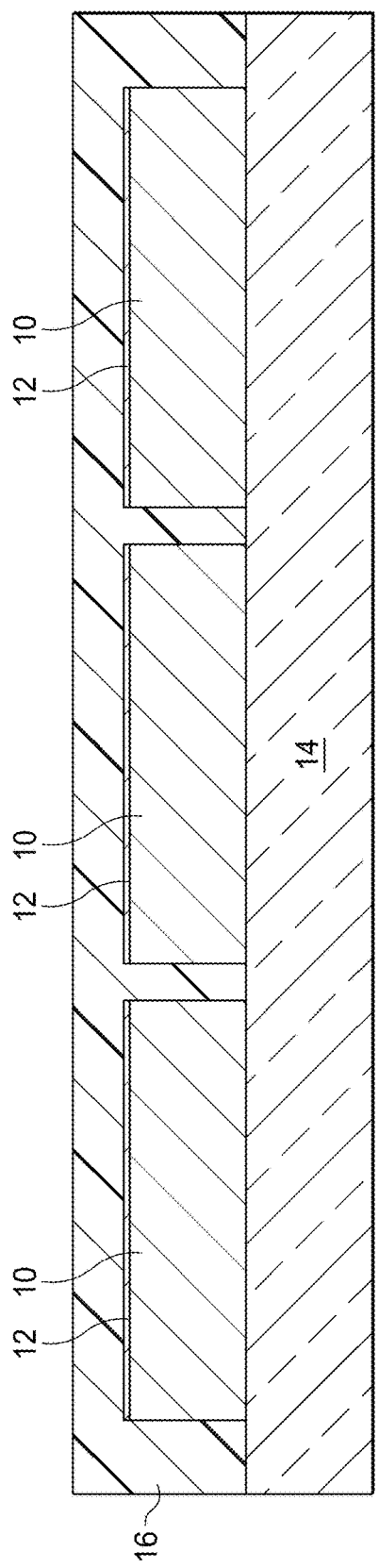

(51) Int. Cl.
*H01L 23/13* (2006.01)
*H01L 23/36* (2006.01)
*H01L 23/498* (2006.01)
*H01L 23/538* (2006.01)
*H01L 23/00* (2006.01)
*H01L 25/03* (2006.01)
*H01L 25/10* (2006.01)
H01L 25/065 (2006.01)

(52) U.S. Cl.
CPC .. *H01L 23/49816* (2013.01); *H01L 23/49894* (2013.01); *H01L 23/5385* (2013.01); *H01L 23/5389* (2013.01); *H01L 24/06* (2013.01); *H01L 24/14* (2013.01); *H01L 24/19* (2013.01); *H01L 24/20* (2013.01); *H01L 24/96* (2013.01); *H01L 24/97* (2013.01); *H01L 25/03* (2013.01); *H01L 25/105* (2013.01); *H01L 25/50* (2013.01); *H01L 24/81* (2013.01); *H01L 25/0657* (2013.01); *H01L 2224/0345* (2013.01); *H01L 2224/03912* (2013.01); *H01L 2224/0401* (2013.01); *H01L 2224/04105* (2013.01); *H01L 2224/05571* (2013.01); *H01L 2224/05573* (2013.01); *H01L 2224/05647* (2013.01); *H01L 2224/0603* (2013.01); *H01L 2224/06051* (2013.01); *H01L 2224/1147* (2013.01); *H01L 2224/1184* (2013.01); *H01L 2224/11334* (2013.01); *H01L 2224/11462* (2013.01); *H01L 2224/11903* (2013.01); *H01L 2224/12105* (2013.01); *H01L 2224/13006* (2013.01); *H01L 2224/13025* (2013.01); *H01L 2224/13082* (2013.01); *H01L 2224/13147* (2013.01); *H01L 2224/13155* (2013.01); *H01L 2224/1403* (2013.01); *H01L 2224/14051* (2013.01); *H01L 2224/16145* (2013.01); *H01L 2224/16227* (2013.01); *H01L 2224/16235* (2013.01); *H01L 2224/16238* (2013.01); *H01L 2224/19* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/81005* (2013.01); *H01L 2224/81192* (2013.01); *H01L 2224/81815* (2013.01); *H01L 2224/83005* (2013.01); *H01L 2224/9222* (2013.01); *H01L 2224/92125* (2013.01); *H01L 2224/96* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/1023* (2013.01); *H01L 2225/1058* (2013.01); *H01L 2924/12042* (2013.01); *H01L 2924/15151* (2013.01); *H01L 2924/15153* (2013.01); *H01L 2924/15159* (2013.01); *H01L 2924/15192* (2013.01); *H01L 2924/15311* (2013.01); *H01L 2924/15321* (2013.01); *H01L 2924/16235* (2013.01); *H01L 2924/16251* (2013.01); *H01L 2924/181* (2013.01); *H01L 2924/18161* (2013.01); *H01L 2924/18162* (2013.01)

(58) Field of Classification Search
CPC ........ H01L 21/76898; H01L 23/49827; G01R 31/318544
See application file for complete search history.

(56) References Cited

U.S. PATENT DOCUMENTS

| | | |
|---|---|---|
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 5,818,404 A | 10/1998 | Lebby et al. |
| 5,895,978 A | 4/1999 | Palagonia |
| 6,002,177 A | 12/1999 | Gaynes et al. |
| 6,025,648 A | 2/2000 | Takahashi et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,271,469 B1 | 8/2001 | Ma et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,603,072 B1 | 8/2003 | Foster et al. |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,791,195 B2 | 9/2004 | Urushima |
| 6,879,041 B2 | 4/2005 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 6/2006 | Kellar et al. |
| 7,056,807 B2 | 6/2006 | Kellar et al. |
| 7,087,538 B2 | 8/2006 | Staines et al. |
| 7,098,542 B1 | 8/2006 | Hoang et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,217,994 B2 | 5/2007 | Zhu et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,632,719 B2 | 12/2009 | Choi et al. |
| 7,659,632 B2 | 2/2010 | Tsao et al. |
| 7,834,450 B2 | 11/2010 | Kang |
| 7,928,582 B2 | 4/2011 | Hutto |
| 8,063,654 B2 * | 11/2011 | Rahman ......... G01R 31/318544 324/762.03 |
| 8,164,171 B2 | 8/2012 | Lin et al. |
| 8,284,561 B2 | 10/2012 | Su et al. |
| 8,361,842 B2 | 1/2013 | Yu et al. |
| 8,519,537 B2 | 8/2013 | Jeng et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,796,846 B2 | 8/2014 | Lin et al. |
| 8,803,306 B1 | 8/2014 | Yu et al. |

(56) References Cited

U.S. PATENT DOCUMENTS

| | | | |
|---|---|---|---|
| 8,809,996 B2 | 8/2014 | Chen et al. | |
| 8,829,676 B2 | 9/2014 | Yu et al. | |
| 8,865,521 B2 | 10/2014 | Jeng et al. | |
| 8,877,554 B2 | 11/2014 | Tsai et al. | |
| 8,896,109 B2 | 11/2014 | Pagaila et al. | |
| 8,933,551 B2* | 1/2015 | Chang | H01L 21/76898 257/686 |
| 8,970,023 B2 | 3/2015 | Chou et al. | |
| 2002/0003232 A1 | 1/2002 | Ahn et al. | |
| 2002/0003297 A1 | 1/2002 | Smola et al. | |
| 2002/0081755 A1* | 6/2002 | Degani | H01L 22/20 438/14 |
| 2003/0035270 A1* | 2/2003 | Shieh | H01L 23/055 361/718 |
| 2004/0056344 A1 | 3/2004 | Ogawa et al. | |
| 2004/0245608 A1 | 12/2004 | Huang et al. | |
| 2006/0145328 A1 | 7/2006 | Hsu | |
| 2006/0249828 A1 | 11/2006 | Hong | |
| 2007/0289127 A1 | 12/2007 | Hurwitz et al. | |
| 2008/0116589 A1 | 5/2008 | Li et al. | |
| 2008/0185719 A1 | 8/2008 | Cablao et al. | |
| 2008/0248610 A1* | 10/2008 | Chew | H01L 24/10 438/108 |
| 2008/0265434 A1* | 10/2008 | Kurita | H01L 21/563 257/777 |
| 2008/0272477 A1 | 11/2008 | Do et al. | |
| 2008/0283992 A1 | 11/2008 | Palaniappan et al. | |
| 2008/0315372 A1 | 12/2008 | Kuan et al. | |
| 2009/0065927 A1 | 3/2009 | Meyer | |
| 2009/0121326 A1 | 5/2009 | Kim et al. | |
| 2009/0186446 A1 | 7/2009 | Kwon et al. | |
| 2009/0230531 A1 | 9/2009 | Do et al. | |
| 2009/0243065 A1 | 10/2009 | Sugino et al. | |
| 2009/0309212 A1 | 12/2009 | Shim et al. | |
| 2009/0321921 A1 | 12/2009 | Huang | |
| 2010/0019370 A1 | 1/2010 | Pressel et al. | |
| 2010/0052135 A1 | 3/2010 | Shim et al. | |
| 2010/0102428 A1 | 4/2010 | Lee et al. | |
| 2010/0244219 A1 | 9/2010 | Pagaila et al. | |
| 2010/0276787 A1 | 11/2010 | Yu et al. | |
| 2010/0314749 A1 | 12/2010 | Kurita | |
| 2011/0024888 A1 | 2/2011 | Pagaila et al. | |
| 2011/0210444 A1 | 9/2011 | Jeng et al. | |
| 2011/0241192 A1 | 10/2011 | Ding et al. | |
| 2011/0278732 A1 | 11/2011 | Yu et al. | |
| 2011/0285005 A1 | 11/2011 | Lin et al. | |
| 2011/0291288 A1 | 12/2011 | Wu et al. | |
| 2011/0304999 A1 | 12/2011 | Yu et al. | |
| 2012/0049352 A1 | 3/2012 | Kang et al. | |
| 2012/0286407 A1 | 11/2012 | Choi et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0075903 A1 | 3/2013 | Pagaila et al. | |
| 2013/0082364 A1 | 4/2013 | Wang et al. | |
| 2013/0093097 A1* | 4/2013 | Yu | H01L 21/568 257/774 |
| 2013/0119533 A1* | 5/2013 | Chen | H01L 25/0652 257/737 |
| 2013/0168848 A1 | 7/2013 | Lin et al. | |
| 2013/0182402 A1* | 7/2013 | Chen | H01L 23/49827 361/807 |
| 2013/0214426 A1 | 8/2013 | Zhao et al. | |
| 2013/0252378 A1 | 9/2013 | Jeng et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0353823 A1 | 12/2014 | Park et al. | |
| 2015/0235993 A1 | 8/2015 | Cheng et al. | |
| 2016/0240508 A1 | 8/2016 | Hou et al. | |

FOREIGN PATENT DOCUMENTS

| | | |
|---|---|---|
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Kurita et al., "SMAFTI Package Technology Features Wide-Band and Large-Capacity Memory", Innovative Common Technologies to Support State-of-the-Art Products, pp. 52-56.

Motohashi et al., "SMAFTI Package with Planarized Multilayer Interconnects", IEEE, Electronic Components and Technology Conference, 2009, pp. 599-606.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

* cited by examiner

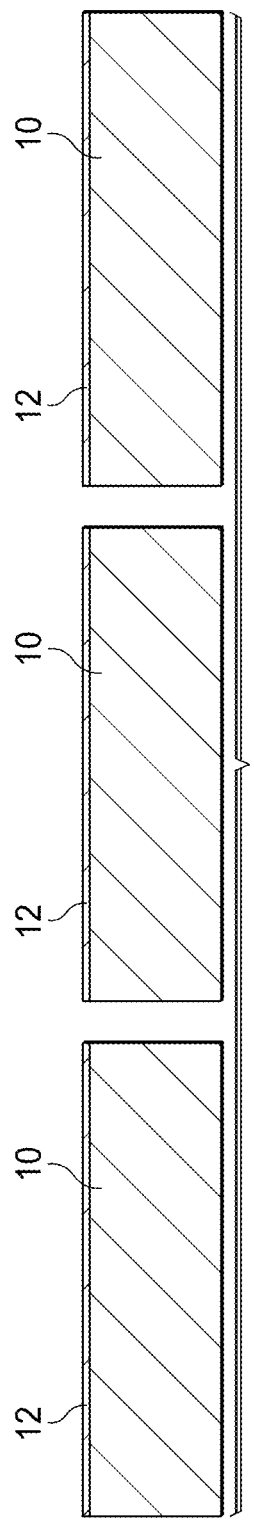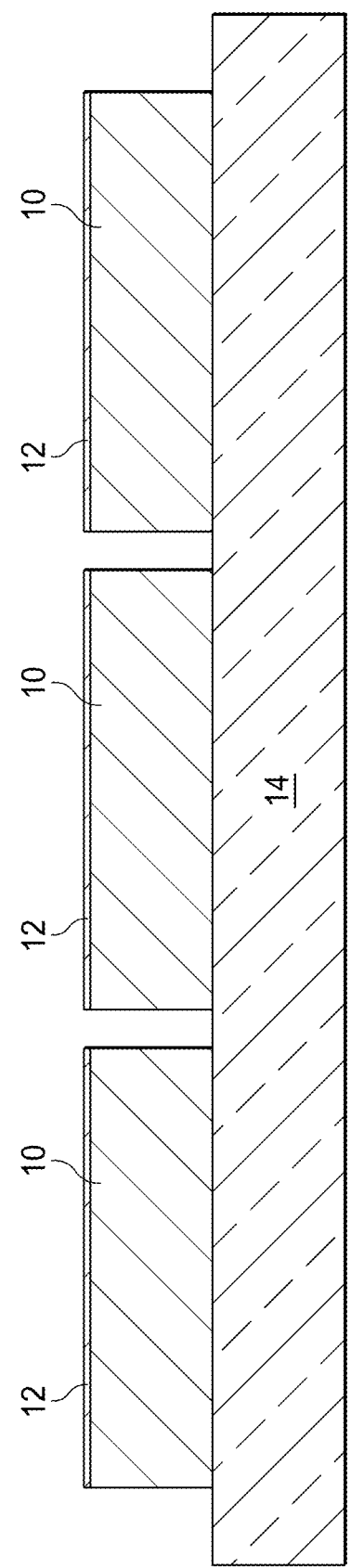

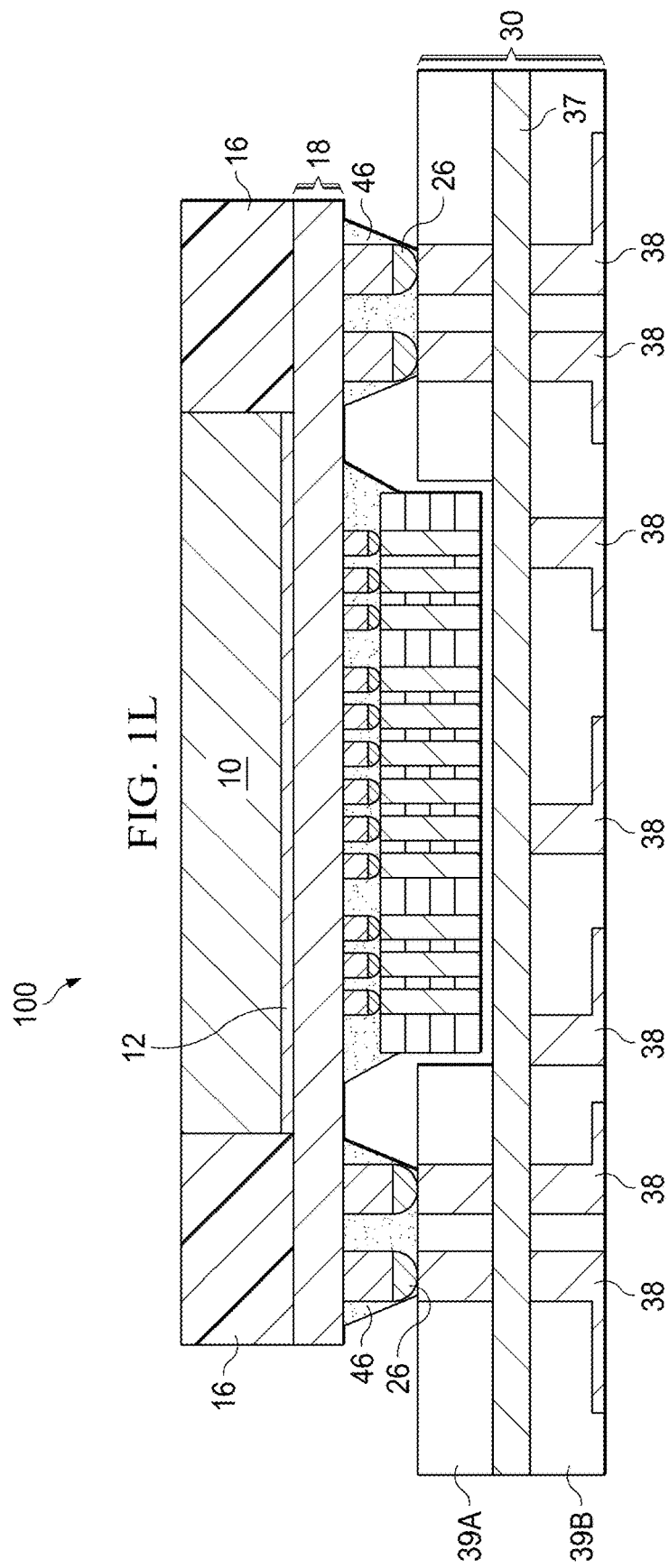

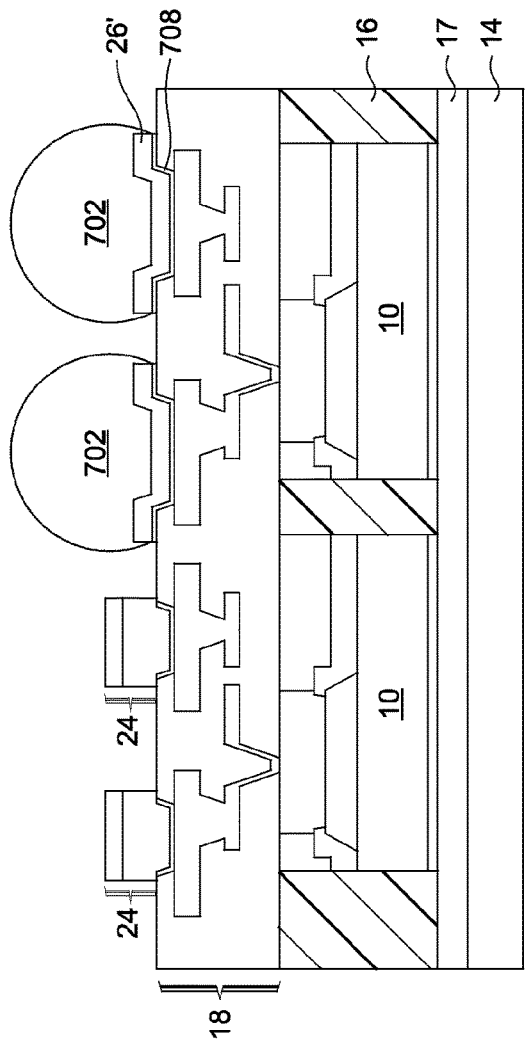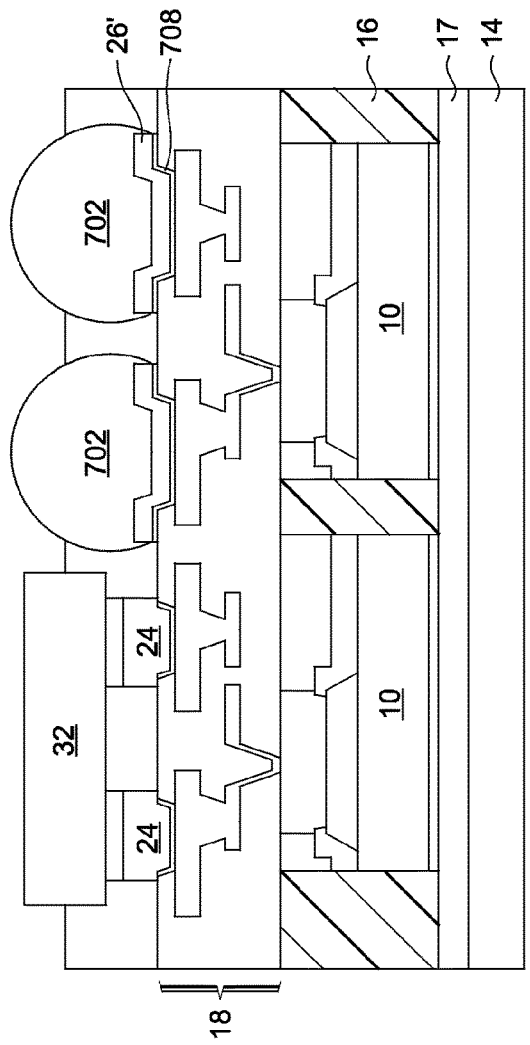
FIG. 8E
FIG. 8F

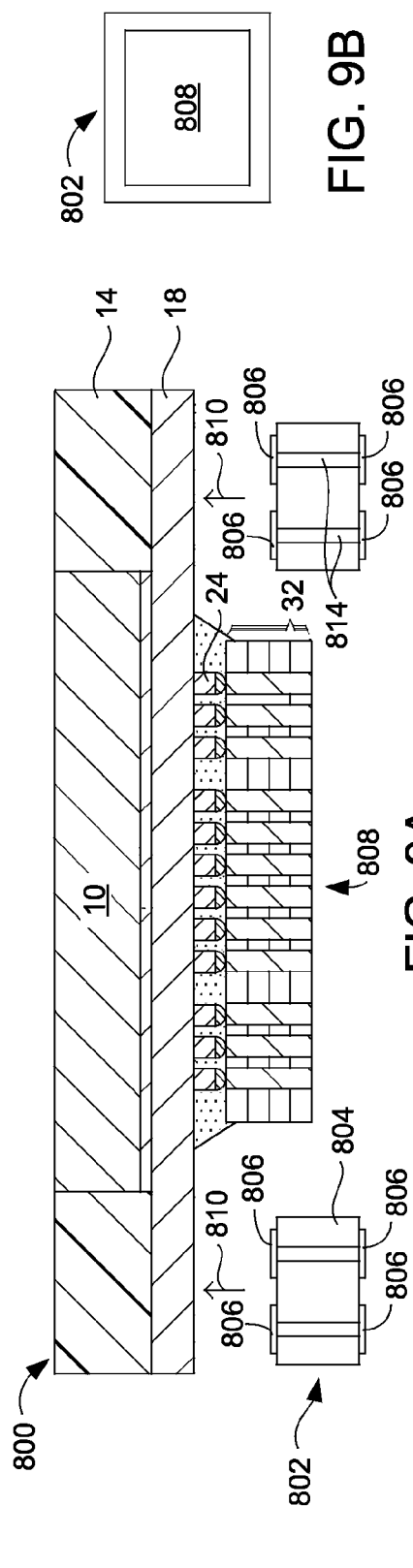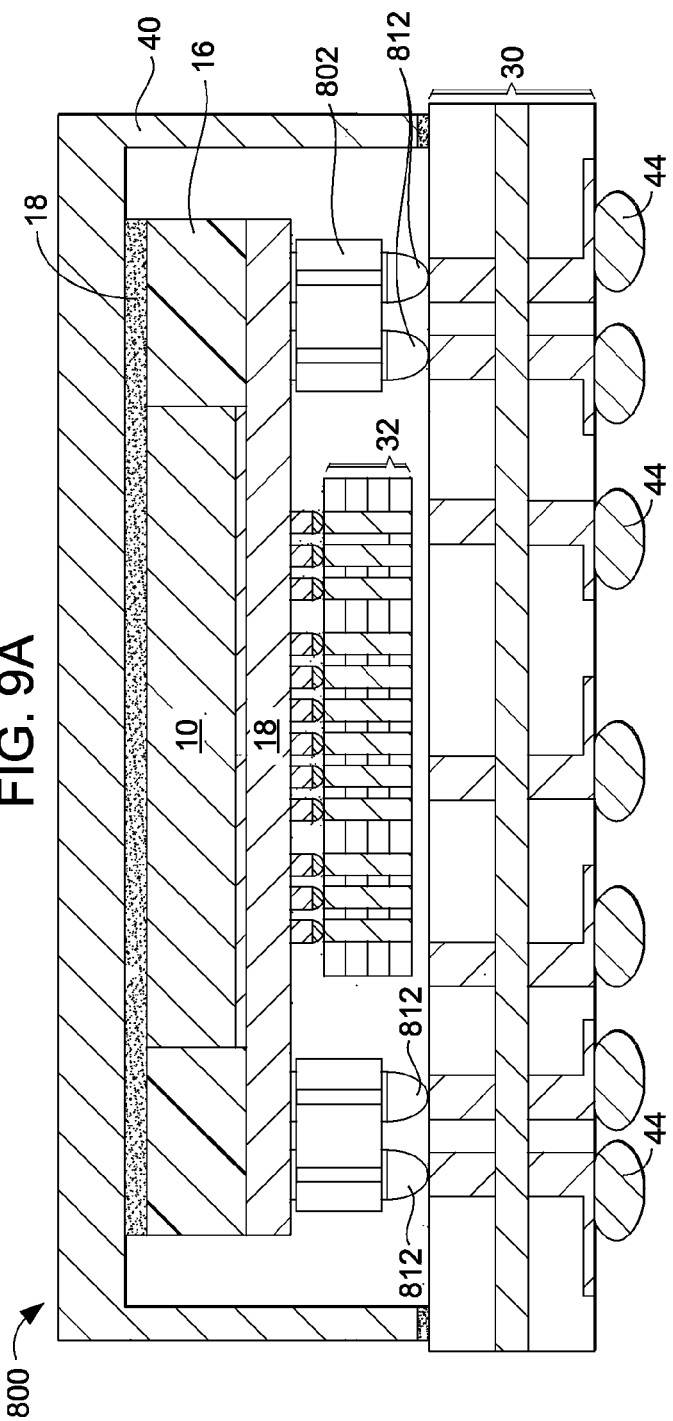

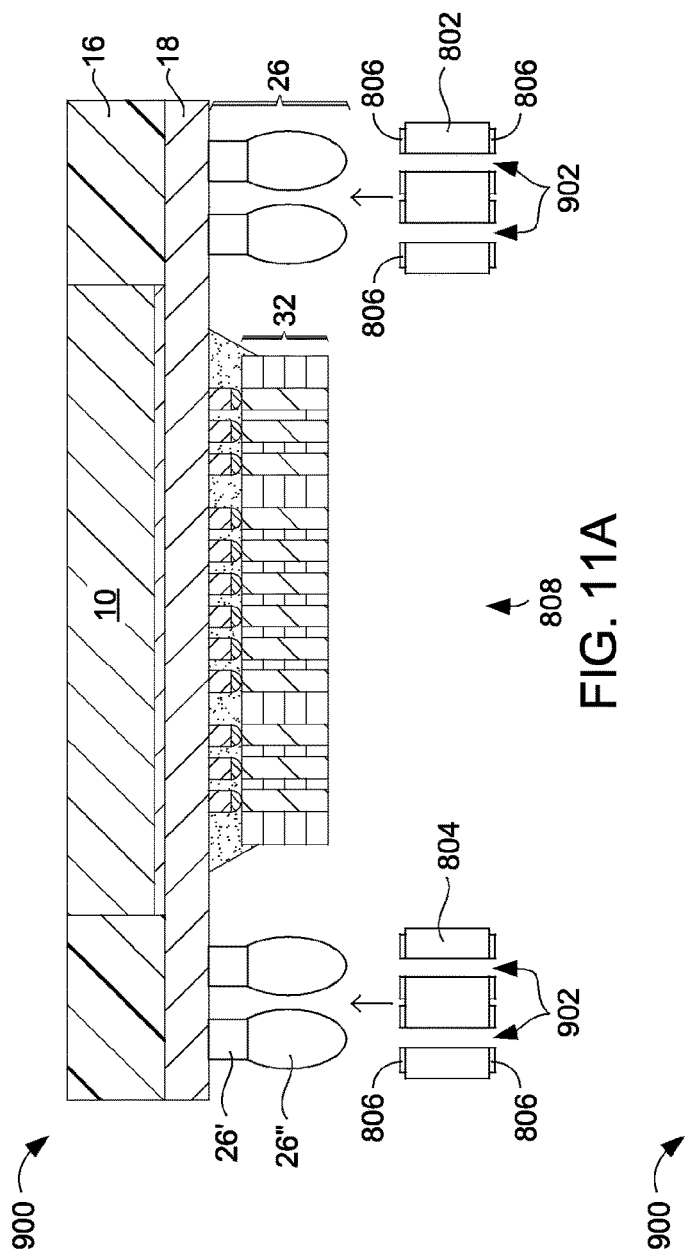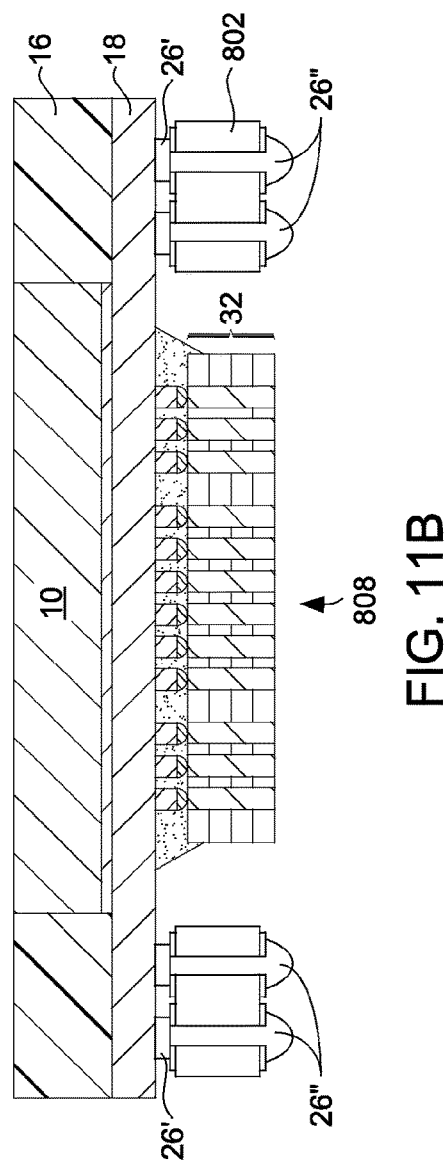

too long interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in contact layer 12 may be made of a metallic material such as aluminum, although other metallic materials may also be used. A passivation layer (not shown) may be formed over contact layer 12 out of non-organic materials such as silicon oxide, un-doped silicate glass, silicon oxynitride, and the like. The passivation layer may extend over and cover edge portions of contact pads in contact layer 12. Openings may be formed in portions of the passivation layer that cover the contact pads, exposing at least a portion of the contact pads in contact layer 12. The various features of dies 10 may be formed by any suitable method and are not described in further detail herein. Furthermore, dies 10 may be formed in a wafer (not shown) and singulated. Functional testing may be performed on dies 10. Thus, dies 10 in FIG. 1A may include only known good dies, which have passed one or more functional quality tests.

Next, referring to FIG. 1B, dies 10 may be placed on a carrier 14. Carrier 14 may be made of a suitable material, for example, glass or a carrier tape. Dies 10 may be affixed to carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under dies 10 prior to their placement on carrier 14.

In FIG. 1C, a molding compound 16 may be used to fill gaps between dies 10 and to cover top surfaces of dies 10. Molding compound 16 may include any suitable material such as an epoxy resin, a molding underfill, and the like. Suitable methods for forming molding compound 16 may include compressive molding, transfer molding, liquid encapsulent molding, and the like. For example, molding compound 16 may be dispensed between dies 10 in liquid form. A curing process may then be performed to solidify molding compound 16.

Figure 1D:
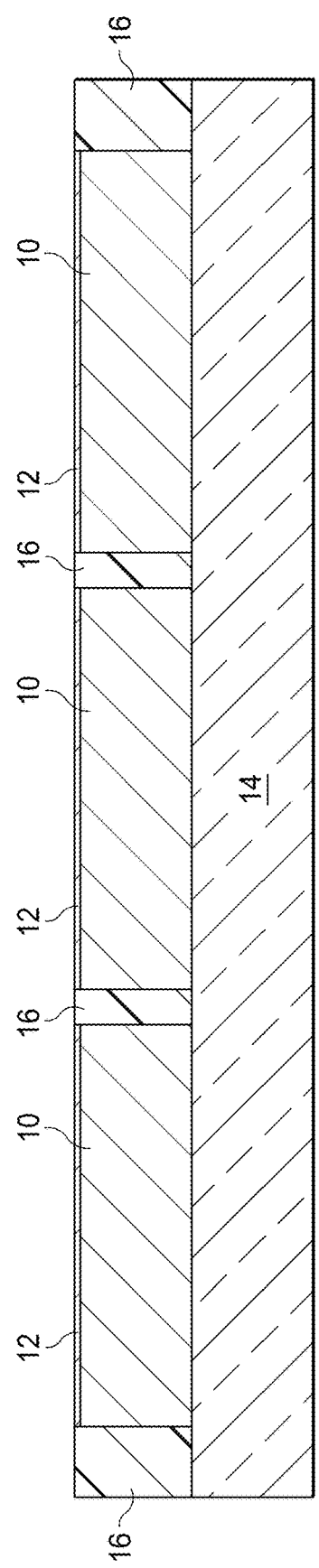

In FIG. 1D, a planarization process, such as a grinding process (e.g., a chemical-mechanical polish (CMP) or mechanical grinding) or etch back, may be performed on molding compound 16 to expose contact layer 12 (and any contact pads therein) on dies 10. In a top down view of dies 10 (not shown), molding compound 16 may encircle dies 10.

Figure 1E:
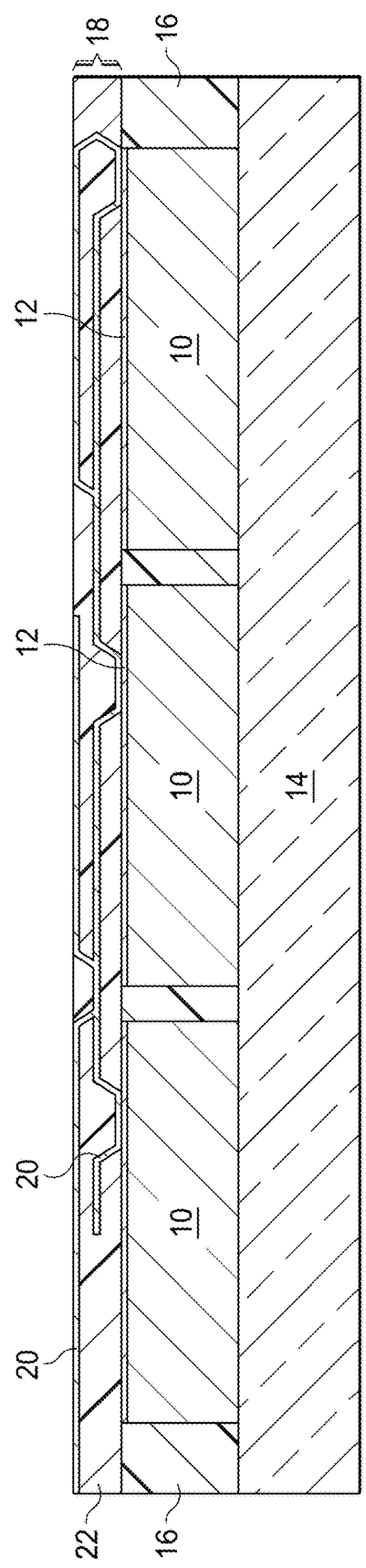

FIG. 1E illustrates the formation of redistribution layers (RDLs) 18 over dies 10 and molding compound 16. As illustrated by FIG. 1E, RDLs 18 may extend laterally past edges of dies 10 over molding compound 16. RDLs 18 may include interconnect structures 20 formed in one or more polymer layers 22. Polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like.

Interconnect structures 20 (e.g., conductive lines and/or vias) may be formed in polymer layers 22 and electrically connected to contact layer 12 of dies 10. The formation of interconnect structures 20 may include patterning polymer layers 22 (e.g., using a combination of photolithography and etching processes) and forming interconnect structures 20 (e.g., depositing a seed layer and using a mask layer to define the shape of interconnect structures 20) in the patterned polymer layers 22. Interconnect structures 20 may be formed of copper or a copper alloy although other metals such as aluminum, gold, and the like may also be used. Interconnect structures 20 may be electrically connected to contact pads in contact layer 12 (and as a result, active devices) in dies 10.

Figure 1F:
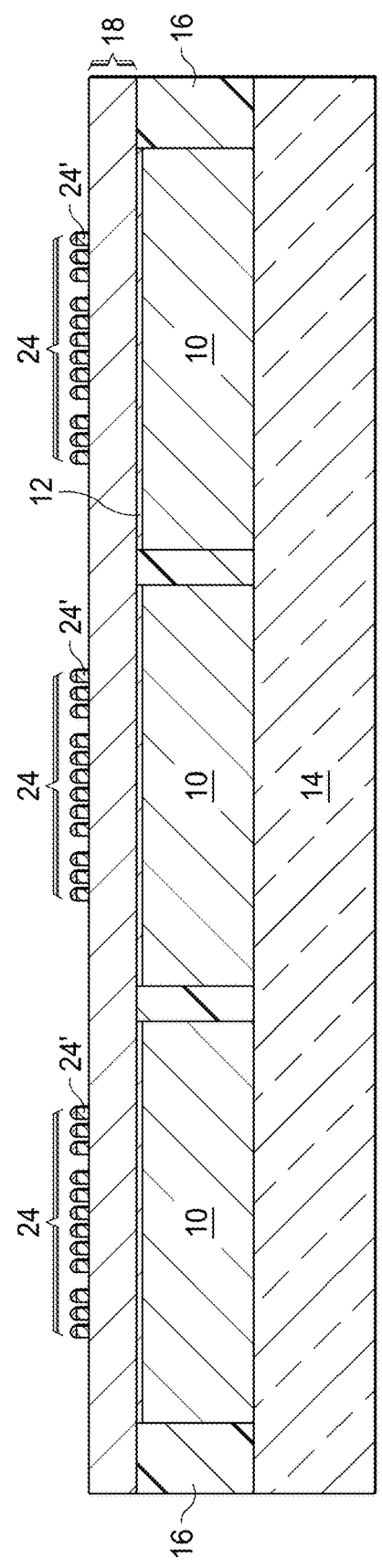
Figure 1G:
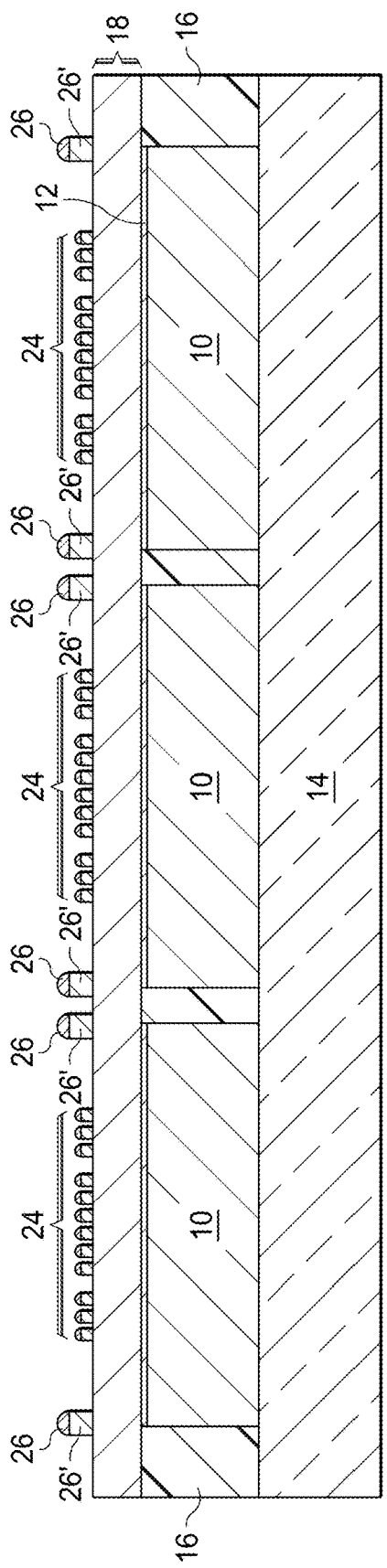

FIGS. 1F and 1G illustrate the formation of connectors 24 and 26 over RDLs 18. Notably, connectors 24 and 26 are formed on a same side of dies 10 (i.e., on a same surface of RDLs 18). Connectors 24 and 26 may be formed of any suitable material (e.g., copper, solder, and the like) using any suitable method. In some embodiments, the formation of connectors 24 and 26 may first include the formation of under bump metallurgies (UBMs) 24'/26' electrically connected to active devices in dies 10 through RDLs 18. Connectors 24 and 26 may extend laterally past edges of dies 10, forming fan-out interconnect structures. Thus, the inclusion of RDLs 18 may increase the number of connectors 24 and 26 (e.g., input/output pads) connected to dies 10. The increased number of connectors 24 and 26 may allow for increased bandwidth, increased processing speed (e.g., due to shorter signaling paths), lower power consumption (e.g., due to shorter power conduction paths), and the like in subsequently formed IC packages (e.g., package 100 of FIG. 1N).

Furthermore, connectors 24 and 26 may vary in size. For example, connectors 24 may be microbumps having a pitch of about 40 μm or more while connectors 26 may be controlled collapse chip connection (C4) bumps having a pitch of about 140 μm to about 150 μm. In alternative embodiments, connectors 24 and 26 may include different dimensions. Thus, as illustrated by FIGS. 1F and 1G, connectors 24 may be formed prior to connectors 26 to allow for the size differences.

The differing sizes of connectors 24 and 26 may allow different electrical devices (e.g., having differently sized connectors) to be bonded to dies 10. For example, connectors 24 may be used to electrically connect dies 10 to one or more other device dies 28 (see FIG. 1H), and connectors 26 may be used to electrically connect dies 10 to a package substrate 30 (e.g., a printed circuit board, interposer, and the like, see FIG. 1K). Furthermore, because connectors 24 and 26 are formed on a same side of dies 10, the different electrical devices may also be bonded to a same side of dies 10. Although a particular configuration of dies 10 and RDLs 18 is illustrated, alternative configurations may be applied (e.g., having a different number of RDLs 18 and/or connectors 24/26) in alternative embodiments.

Figure 1H:
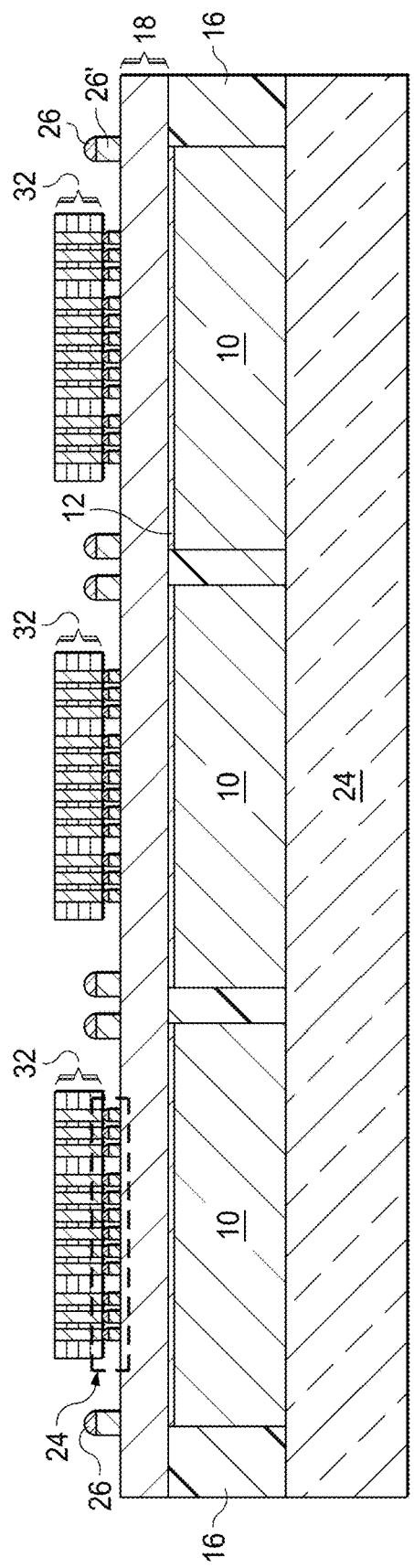
Figure 1I:
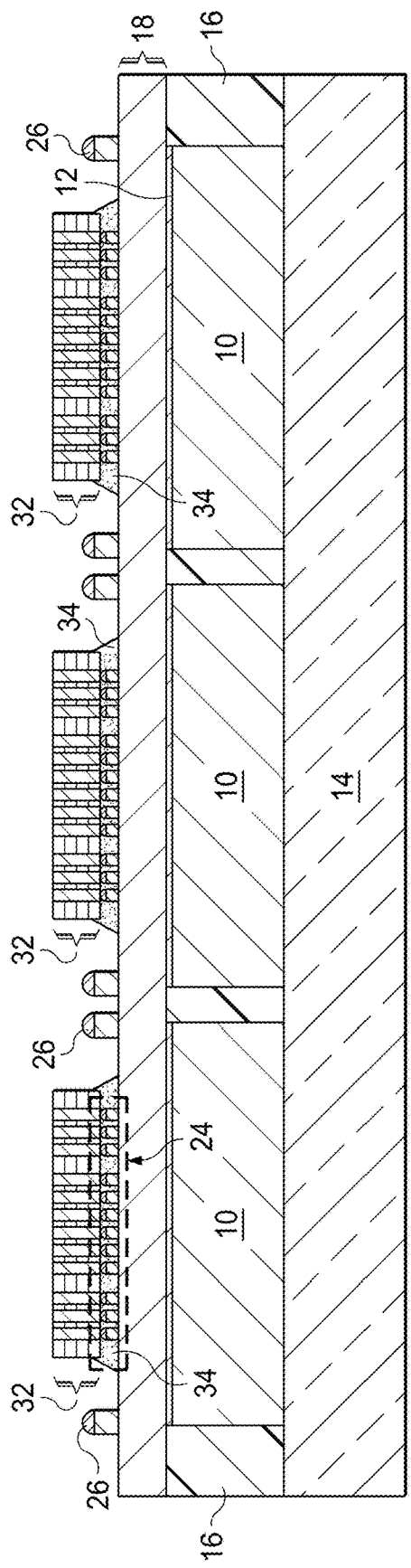

In FIG. 1H, a plurality of dies 32 may be bonded to dies 10 through connectors 24 (e.g., by reflowing connectors 24) to form die stacks 10/32. Dies 32 may be electrically connected to active devices in dies 10 through RDLs 18. In some embodiments, die stack 10/32 may include memory dies 32 (e.g., dynamic random access memory (DRAM) dies) bonded to dies 10, which may be logic dies providing control functionality for memory dies 32. In alternative embodiments, other types of dies may be included in dies stacks 10/32. Next, as illustrated in FIG. 1I, underfill 34 may be dispensed between dies 32 and RDLs 18 around connectors 24. Underfill 34 may provide support for connectors 24.

Figure 1J:
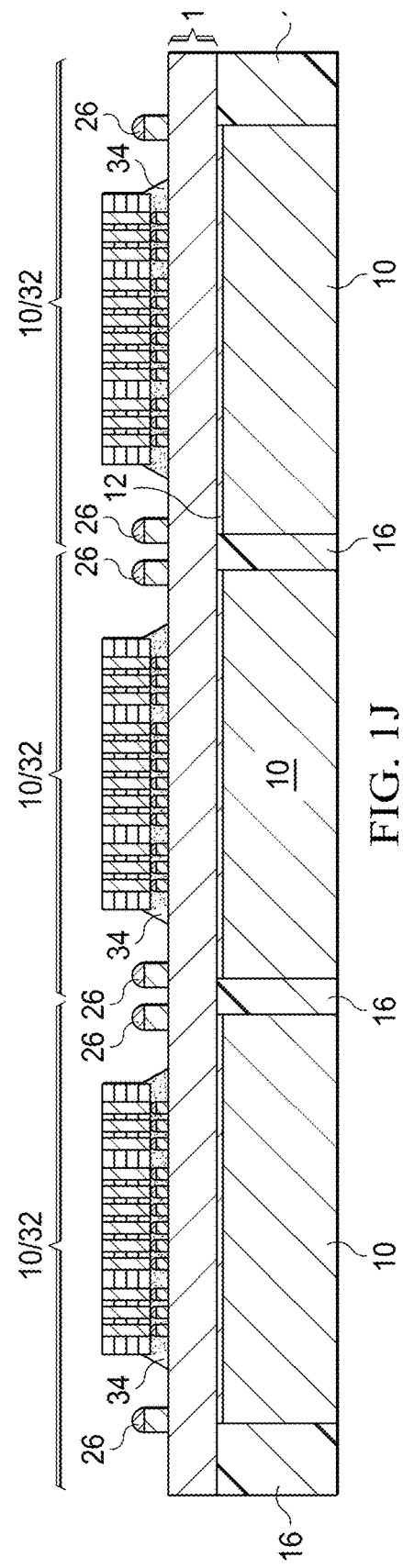

FIG. 1J illustrates the removal of carrier 14 from die stack 10/32 using any suitable method. For example, in an embodiment in which the adhesive between dies 10 and carrier 14 is formed of UV tape, dies 10 may be removed by exposing the adhesive layer to UV light. Subsequently, die stacks 10/34 may be singulated for packaging in an IC package. The singulation of die stacks 10/34 may include the use of a suitable pick-and-place tool.

Figure 1K:
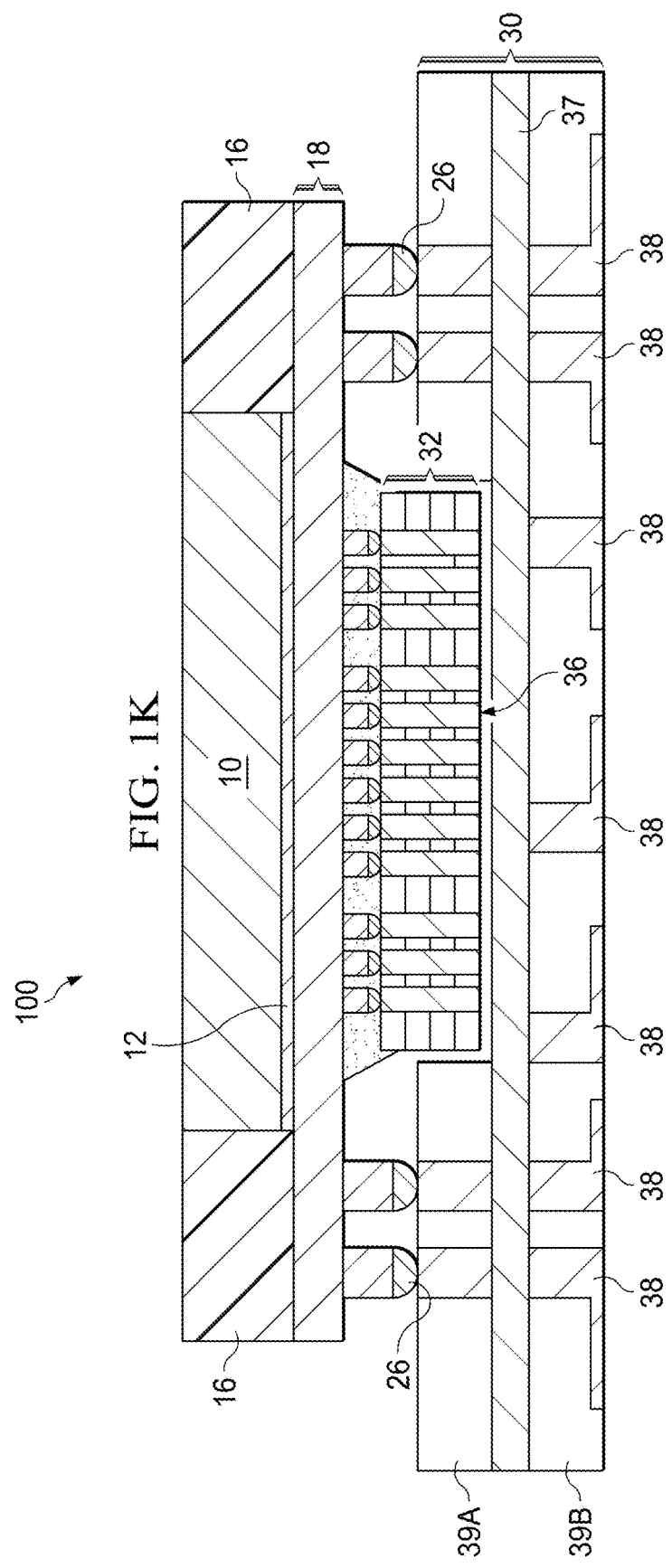

Next, as illustrated by FIG. 1K, each die stack 10/32 may be bonded to a package substrate 30 through connectors 26. A reflow may be performed on connectors 26 to bond die stack 10/32 to package substrate 30. Subsequently, as illustrated by FIG. 1L, an underfill 46 may be dispensed between die stack 10/32 and package substrate 30 around connectors 26. Underfill 46 may be substantially similar to underfill 34.

Package substrate 30 may be an interposer, a printed circuit board (PCB), and the like. For example, package substrate 30 may include a core 37 and one or more build-up layers 39 (labeled 39A and 39B) disposed on either side of core 37. Interconnect structures 38 (e.g., conductive lines, vias, and/or through vias) may be included in package substrate 30 to provide functional electrical purposes such as power, ground, and/or signal layers. Other configurations of package substrate 30 may also be used.

Furthermore, package substrate 30 may include a cavity 36. Cavity 36 may not extend through package substrate 30. Rather, a portion or all of build-up layers 39A (e.g., build-up layers 39 disposed on a same side of core 37 as die stack 10/32) may be patterned to form cavity 36. As illustrated in FIG. 1L, cavity 36 may not affect the configuration of core 37 and/or build-up layers 39B (e.g., build-up layers 39 disposed on an opposite side of core 37 as die stack 10/32). The configuration of package substrate 30 may be designed so that active interconnect structures 38 (e.g., power, ground, and/or signal layers in build-up layers 39A) may be routed to avoid cavity 36. Thus, cavity 36 may not substantially interfere with the functionality of package substrate 30.

Figure 4B:
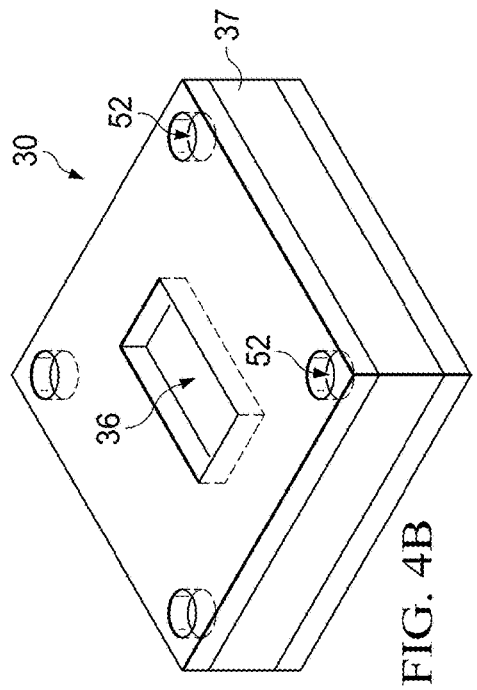
Figure 4D:
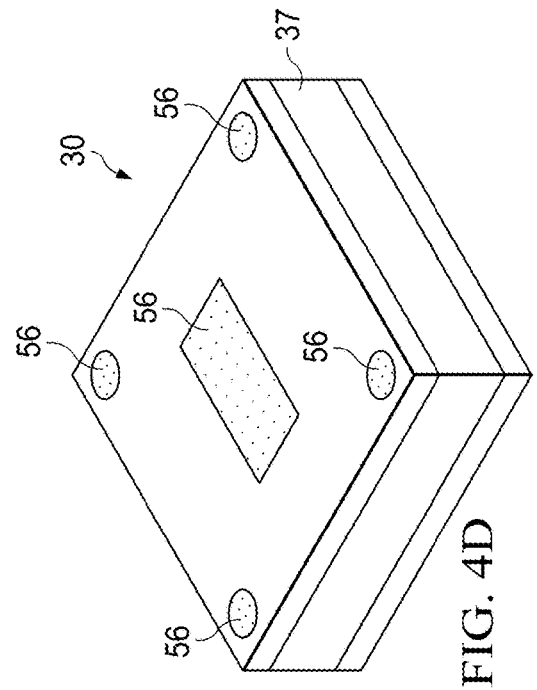
Figure 4A:
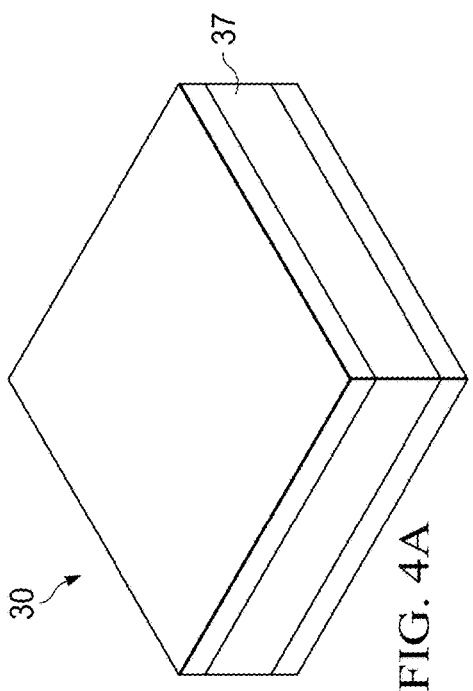

Package substrate 30 may be formed using any suitable method. For example, FIGS. 4A through 4L illustrate prospective views of various intermediary stages of manufacturing a package substrate 30 in accordance with various embodiments. In FIG. 4A, core 37 is provided. Core 37 may be a metal-clad insulated base material such as a copper-clad epoxy-impregnated glass-cloth laminate, a copper-clad polyimide-impregnated glass-cloth laminate, or the like. As illustrated by FIG. 4B, cavity 36 and/or through holes 52 may be formed in core 37, for example, using a mechanical drilling or milling process. The mechanical drilling/milling process may extend through holes 52 through core 37. However, the mechanical drilling/milling process may not extend cavity 36 through core 37.

Figure 4C:
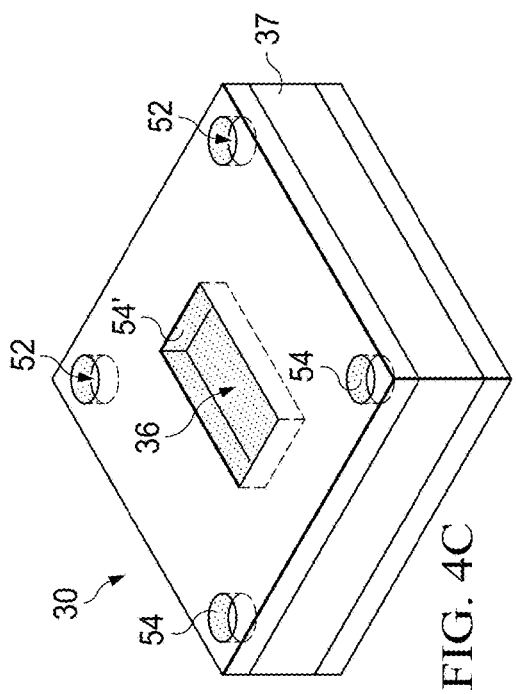

Next, in FIG. 4C, surfaces of through hole 52 and cavity 36 may be plated with metallic material 54, for example, using an electrochemical plating process. In some embodiments, metallic material 54 may comprise copper. The plating of through holes 52 may form through vias for providing electrical connections from one side of core 37 to another. Furthermore, metallic material 54' on surfaces of cavity 36 may act as a laser stop layer in subsequent process steps (see FIG. 4K). In FIG. 4D, cavity 36 and through holes 52 may be filled with a suitable material 56 (e.g., an ink). Material 56 may fill cavity 36/through holes 52 to provide a substantially level surface for forming one or more build-up layers over core 37. A grinding or other planarization technique may be performed on core 37.

Figure 4F:
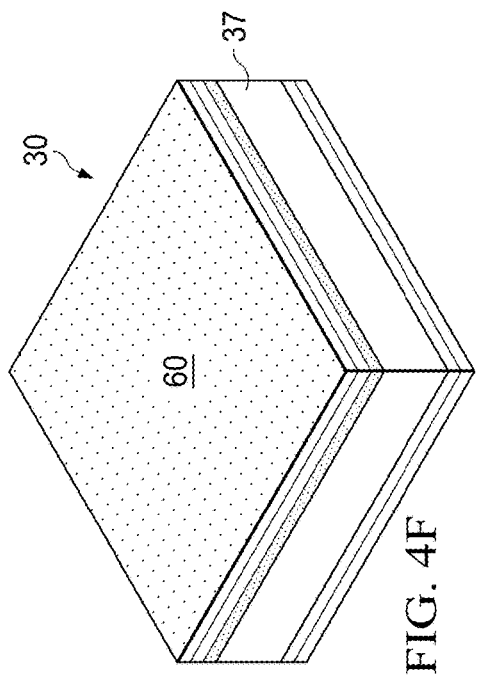
Figure 4H:
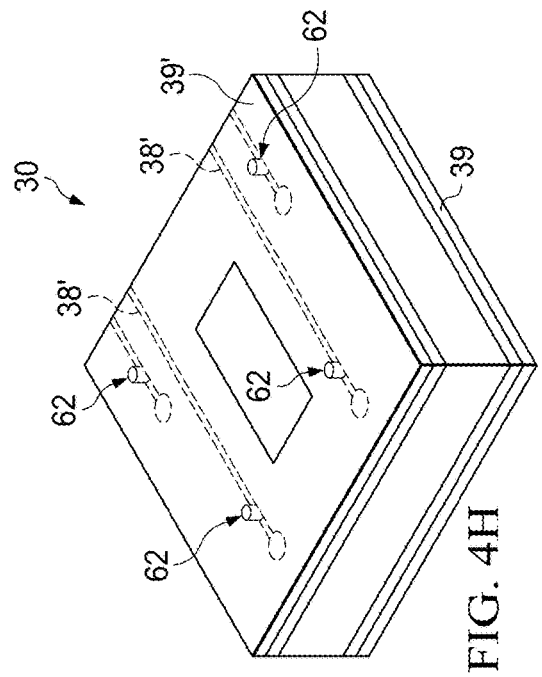
Figure 4E:
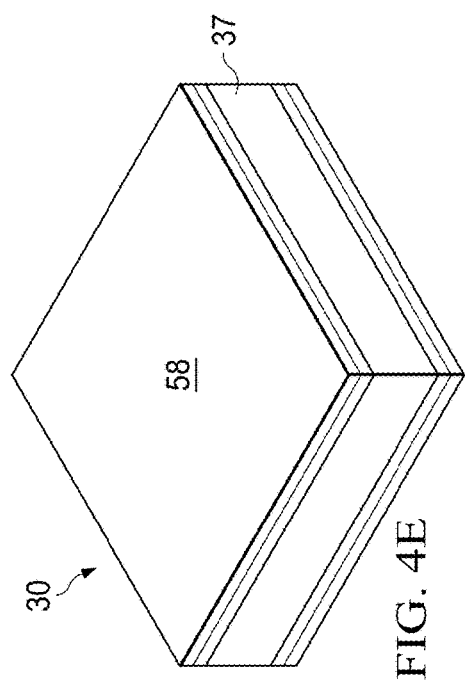
Figure 4G:
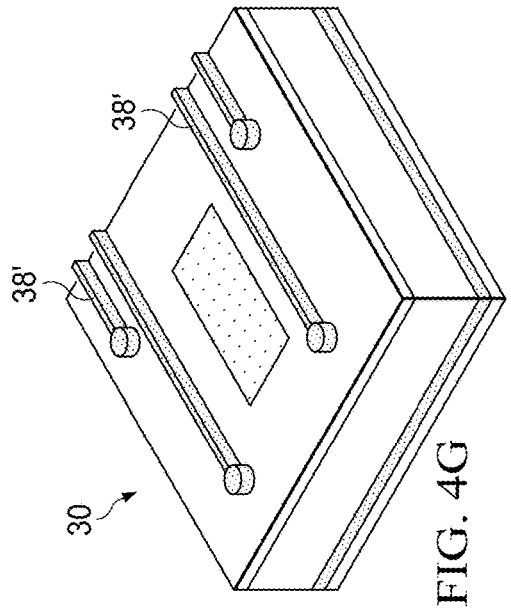

As illustrated by FIGS. 4E through 4I, one or more build-up layers 39 having interconnect structures 38 may be formed on either side of core 37. The formation of build-up layers 39 may include plating core 37 with a conductive layer 58, for example, comprising copper as illustrated by FIG. 4E. Next, as illustrated by FIGS. 4F and 4G, conductive layer 58 may be patterned to form conductive lines 38'. The patterning of conductive layer 58 may include laminating a dry film 60 (e.g., a photoresist) over conductive layer 58, patterning dry film 60 (e.g., using suitable exposure techniques), and etching conductive layer 58 using the patterned dry film 60 as a mask. Subsequently, dry film 60 may be removed.

Figure 4I:
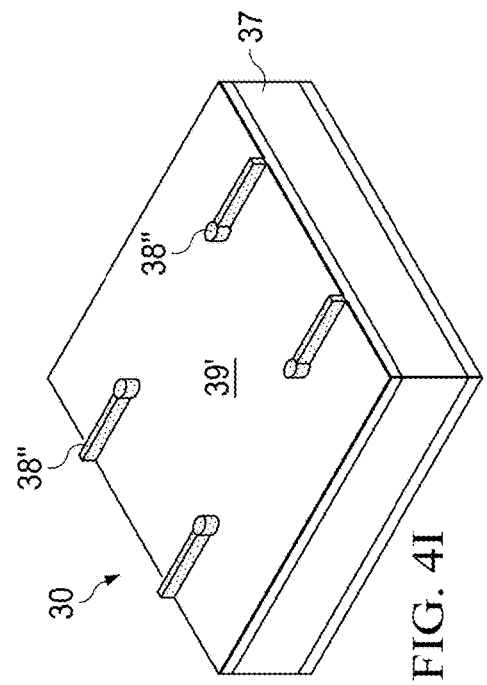

In FIG. 4H, a build-up layer 39' may be laminated over conductive lines 38' (shown in ghost). The lamination of build-up layer 39' may include a curing process (e.g., a heat treatment or pressing process). Openings 62 may be patterned in build-up layer 39' (e.g., through laser drilling), and openings 62 may be aligned with conductive lines 38'. As illustrated by FIG. 4I, additional conductive lines 38" may be formed over build-up layer 39' using a substantially similar process as illustrated by FIGS. 4E through 4H for forming conductive lines 38' (e.g., conductive layer plating and patterning). The conductive layer plating process used for forming conductive lines 38" may also plate openings 62 (not illustrated in FIG. 4H), thus forming conductive vias (not illustrated) for interconnecting conductive lines 38' and 38" through build-up layer 39'. Conductive lines 38" may be patterned to align with conductive vias formed in openings 62. The process steps illustrated by FIGS. 4E through 4I may be repeated as desired to form any number of build-up layers (e.g., power, ground, and/or signal layers) in package substrate 30. Furthermore, although FIGS. 4E through 4I only illustrate the formation of interconnect structures 38/build-up layers 39 on one side of core 37, similar processes may be applied to form of interconnect structures 38/build-up layers 39 on an opposing side of core 37.

Figure 4J:
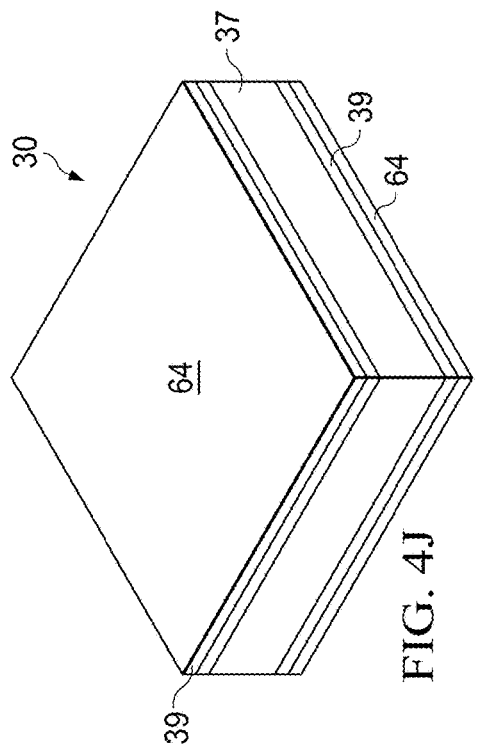
Figure 4K:
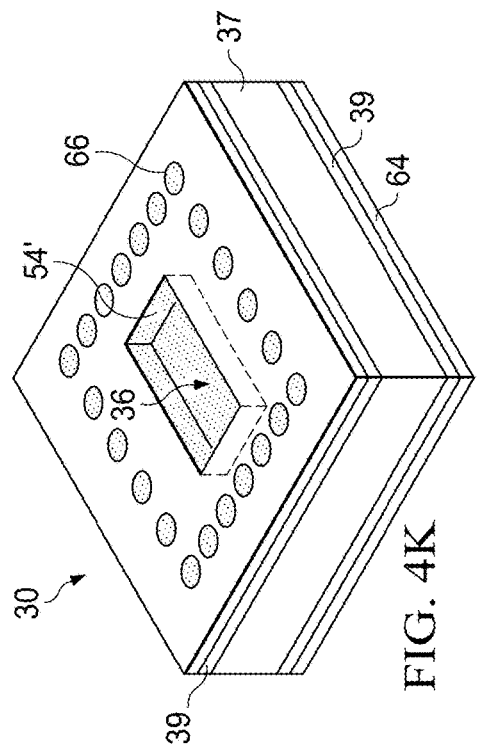
Figure 4L:
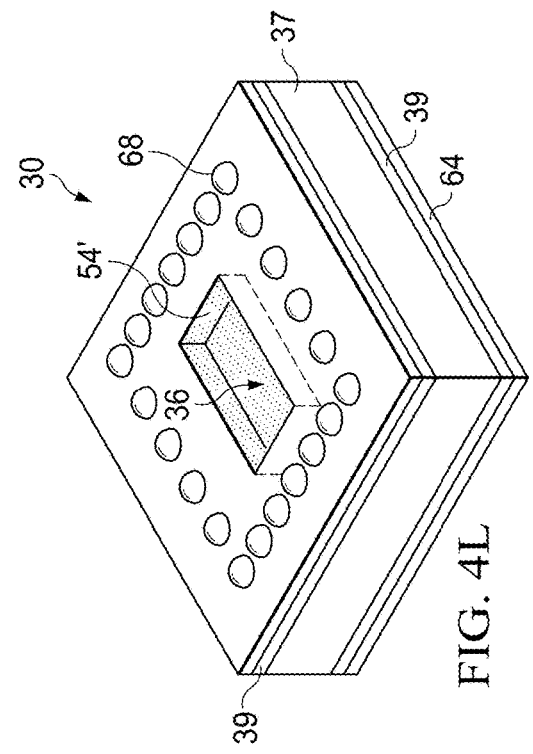

FIG. 4J a solder resist 64 may be formed over build-up layers 39 (e.g., on both sides of core 37). Next, as illustrated by FIG. 4K, cavity 36 may be patterned in package substrate 30. The formation of cavity 36 may include patterning solder resist 63 (e.g., using an exposure technique) and a laser etching build-up layers 39 using material 54' as a laser stop layer. Thus, cavity 36 may not extend through package substrate 30. Furthermore, the patterning of solder resist 64 may pattern openings (not shown) around cavity 36 to expose interconnect structures 38 in build-up layers 39. These openings may be plated with a suitable material (e.g., nickel, aluminum, or the like) to form contact pads 66 on package substrate 30. Contact pads 66 may be electrically connected to interconnect structures 38 in build-up layers 39. Subsequently, as illustrated by FIG. 4L, connectors 68 (e.g., solder balls) may be formed on contact pads 66 for bonding with die stack 10/32.

Referring back to FIG. 1L, when die stack 10/34 is bonded to package substrate 30, dies 32 may be disposed, at least partially, in cavity 36. In a top down view of package 100 (not shown), cavity 36 may encircle dies 32. Thus, the bonded structure may advantageously have a relatively small form factor and higher bandwidth. Furthermore, dies 32 may be electrically connected to package substrate 30 through RDLs 18 and connectors 24/26. In some embodiments, dies 10 may include fewer or be substantially free of through-substrate vias (TSVs) for electrically connecting dies 32 to package substrate 30. The reduced number of TSVs may lower the cost of manufacturing dies 10.

Figure 1M:
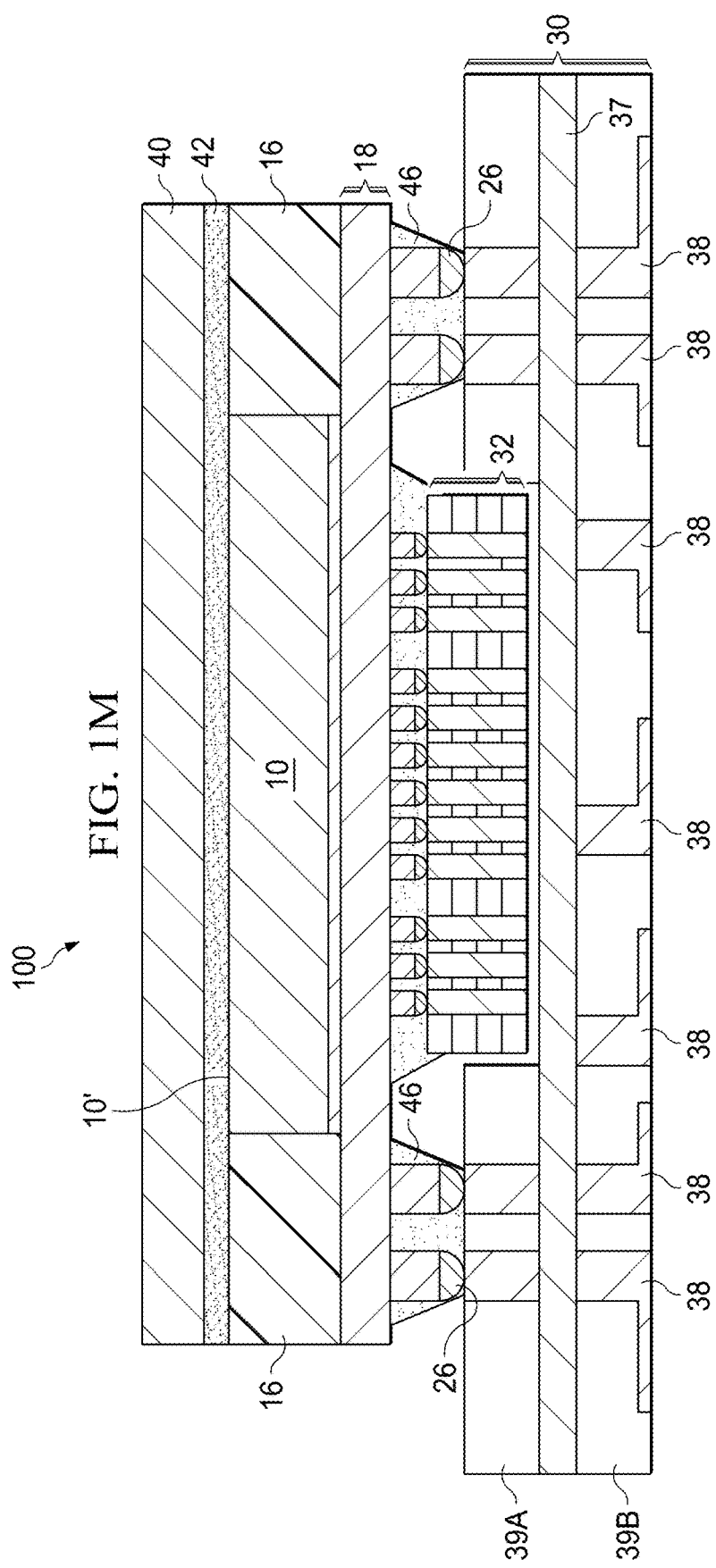

Next, referring to FIG. 1M, a heat dissipation feature 40 is disposed over die 10. Heat dissipation feature 40 may be disposed on a surface of die 10 opposite RDLs 18, connectors 24, and dies 32. Heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, heat dissipation feature 40 may comprise metals and/or metal alloys such as Al, Cu, Ni, Co, combinations thereof, and the like. Heat dissipation feature 40 may also be formed of a composite material, for example silicon carbide, aluminum nitride, graphite, and the like. In some embodiments, heat dissipation feature 40 may also extend over surfaces of molding compound 16.

Compared to conventional 3DICs, where package substrate 30 and dies 32 would be disposed on opposing sides of die 10, package 100 provides die 10 with a surface 10', which may not be used to electrically connect to dies 32 or package substrate 30. Thus, heat dissipation feature 40 may be directly disposed on surface 10' of die 10 for improved heat dissipation.

Interfacing material 42 may be disposed between heat dissipation features 40 and die 10/molding compound 16. Interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) die 10 and heat dissipation feature 40. Furthermore, interfacing material 42 may also include an adhesive (e.g., an epoxy, silicon resin, and the like) for affixing heat dissipation lid 40 to die 10/molding compound 16. The adhesive used may have a better adhering ability and a lower thermal conductivity than a TIM. For example, the adhesive used may have a thermal conductivity lower than about 0.5 W/m·K. As such, the adhesive portions of interfacing material 42 may be disposed over areas having lower thermal dissipation needs (e.g., over surfaces of molding compound 16).

Figure 1N:
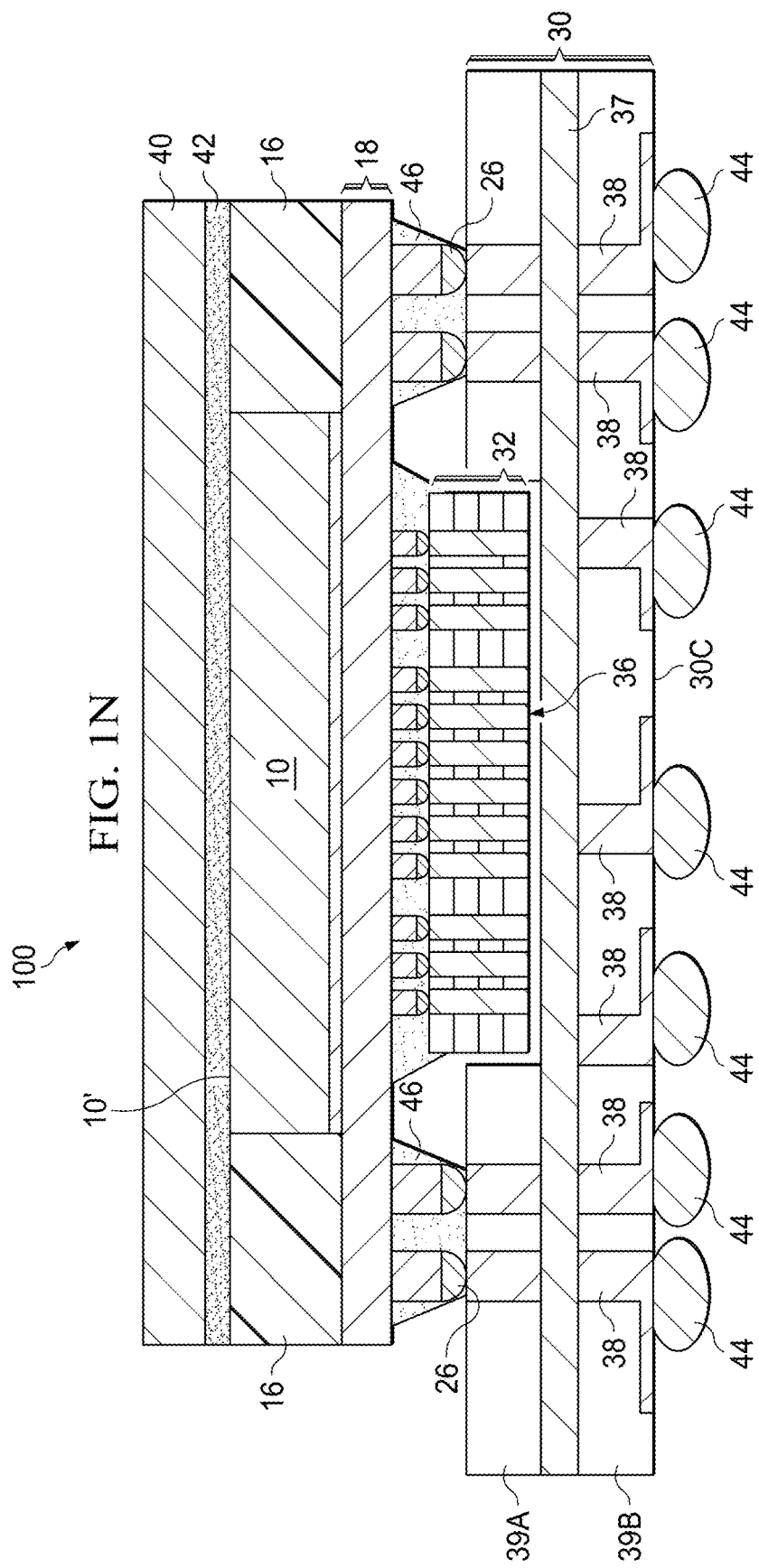

After the attachment of heat dissipation feature 40, a marking process (e.g., laser marking) may be performed to mark package 100. Furthermore, as illustrated by FIG. 1N, connectors 44 (e.g., ball grid array (BGA) balls) disposed on a surface of package substrate 30 opposite connectors 26 and die stack 10/32. Connectors 44 may be used to electrically connect package 100 to a motherboard (not shown) or another device component of an electrical system.

FIG. 1N illustrates a completed package 100. Because dies 32 is disposed in a cavity 36 of package substrate 30, package 100 may have a relatively small form factor and higher bandwidth. The inclusion of RDL 18 may allow for a greater number of I/O pads for die stack 10/32, which allows various performance advantages such as increased speed, lower power consumption, and the like. Furthermore, package substrate 30 and dies 32 may be disposed on a same side of die 10, allowing heat dissipation feature 40 to be directly disposed on a surface of die 10 for improved heat dissipation.

Figure 2:
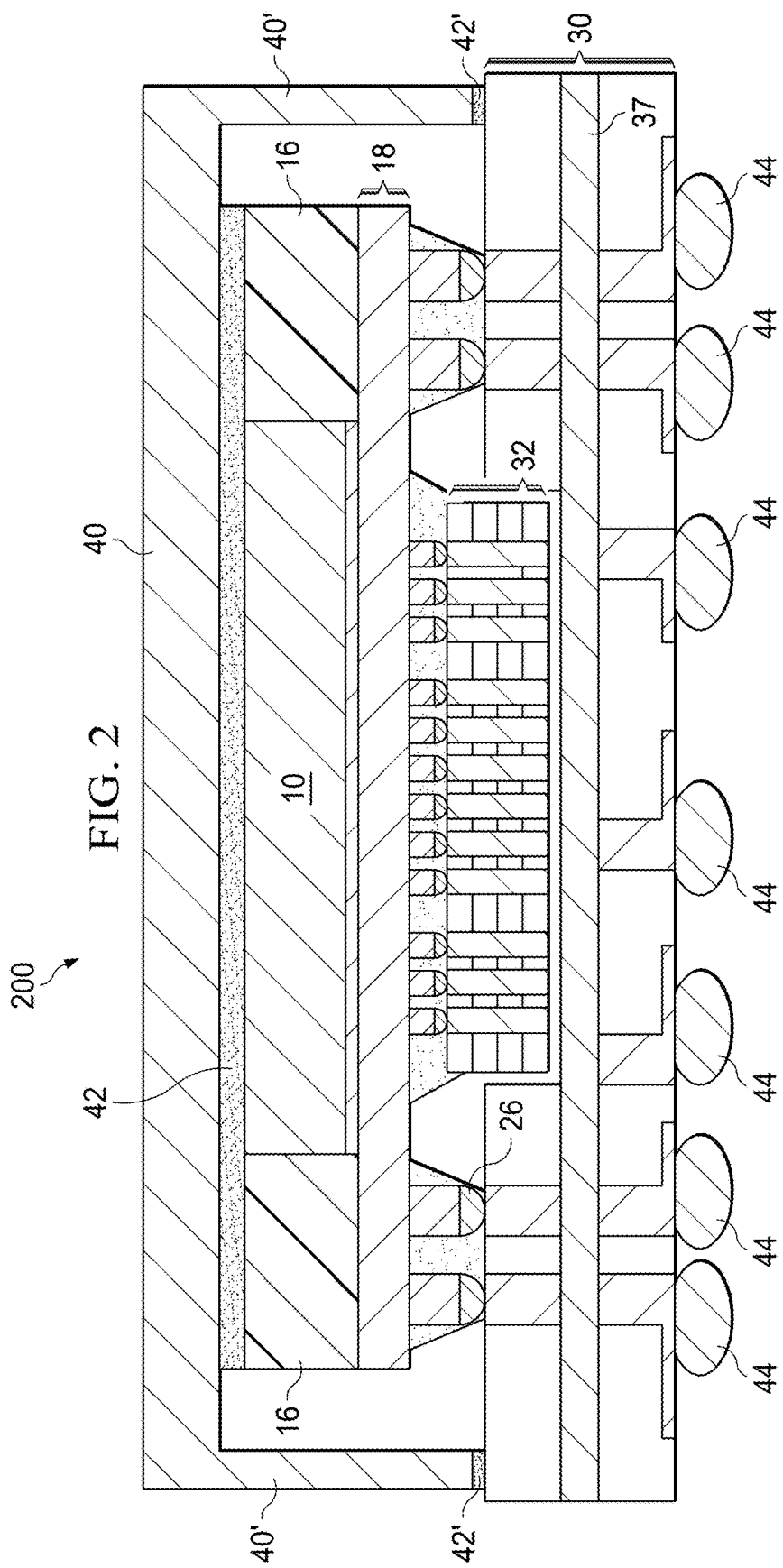

FIG. 2 illustrates a cross-sectional view of a package 200 in accordance with various alternative embodiments. Package 200 may be substantially similar to the package 100 where like reference numerals represent like elements. However, heat dissipation feature 40 may include a contour ring portion 40', which may extend past die 10 and RDLs 18 to a top surface of package substrate 30. In a top down view of package 200 (not shown), contour ring portion 40' may encircle die 10. Contour ring portion 40' may be formed of substantially similar materials as the remainder of heat dissipation lid 40 (e.g., a high Tk material) and provide additional heat dissipation for package 200. Contour ring portion 40' may be attached to package substrate 30 using any suitable method such as an adhesive layer 42' disposed between contour ring portion 40' and package substrate 30.

Figure 3A:
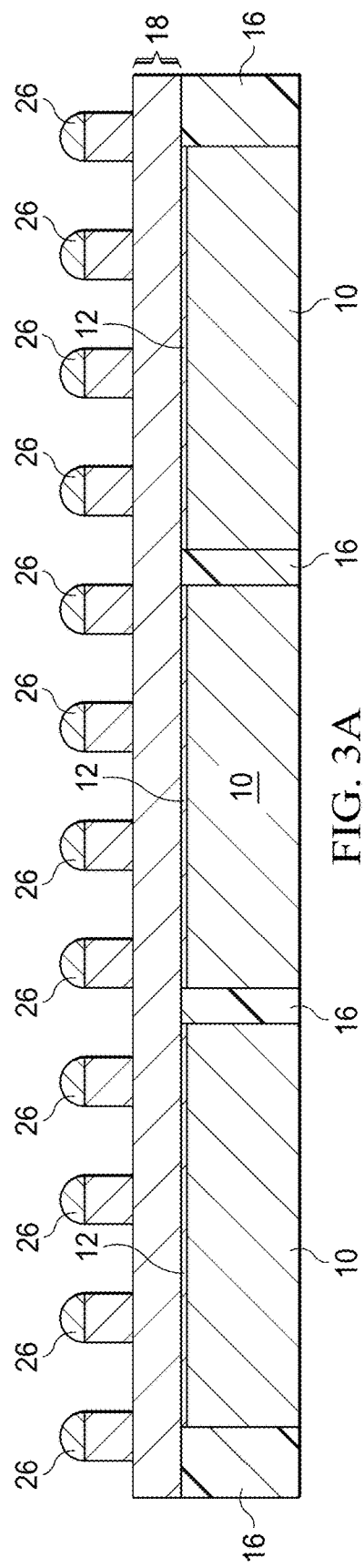

FIGS. 3A through 3E illustrates various intermediary steps of manufacturing package 300 in accordance with alternative embodiments. FIG. 3A illustrates a plurality of dies 10 having an RDL 18 and connectors 26 formed over dies 10. The various features illustrated in FIG. 2A may be formed using substantially the same steps and be substantially similar to the features formed in FIGS. 1A through 1J where like reference numerals represent like elements. Thus, detailed description of the features and their formation is omitted for brevity. However, as illustrated by FIG. 2A, dies 10 (including RDLs 18 and connectors 24) may be detached from a carrier (e.g., carrier 14) without the bonding on dies 32. Furthermore, connectors 24 may not be formed over RDLs 18. Instead, the structure illustrated in FIG. 2A includes connectors 26 on RDLs 18 may be of substantially the same size. For example, connectors 26 may be C4 bumps.

Figure 3B:
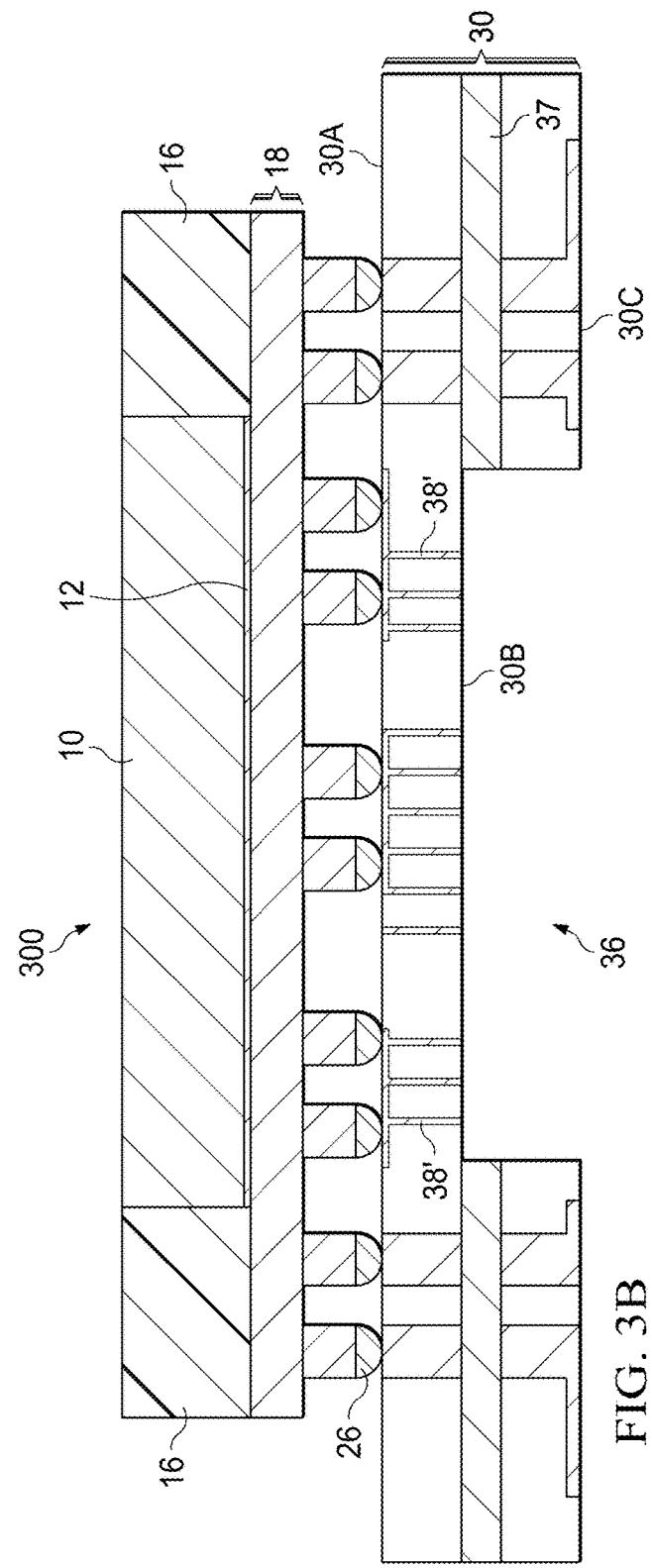

FIG. 3B illustrates the singulation of dies 10 (e.g., along scribe lines using a suitable pick and place tool) and the attachment of dies 10 to package substrate 30 through connectors 26. Notably, die 10 may be bonded to package substrate 30 prior to the attachment of dies 32 to package 300.

The configuration of package substrate 30 in package 300 may be altered from the configuration in package 100. For example, cavity 36 may be disposed on an opposing side (rather than a same side) of package substrate 30. In package 300, die 10 may be bonded to a surface 30A of package substrate 30. Surface 30A may be substantially level. Package substrate 30 may further include surface 30B (e.g., in cavity 36) and surface 30C opposing die 10. Due to the inclusion of cavity 36, surfaces 30B and 30C may not be substantially level. For example, in the orientation illustrated by FIG. 3B, surface 30B may be higher than surface 30C.

The formation of package substrate 30 having cavity 36 may include the patterning of core 37, build-up layer 39B (e.g., disposed on an opposing side of core 37 as die 10), and/or build-up layer 39A (e.g., disposed on a same side of core 37 as die 10). In various embodiments, cavity 36 may not extend through package substrate 30.

Figure 3C:
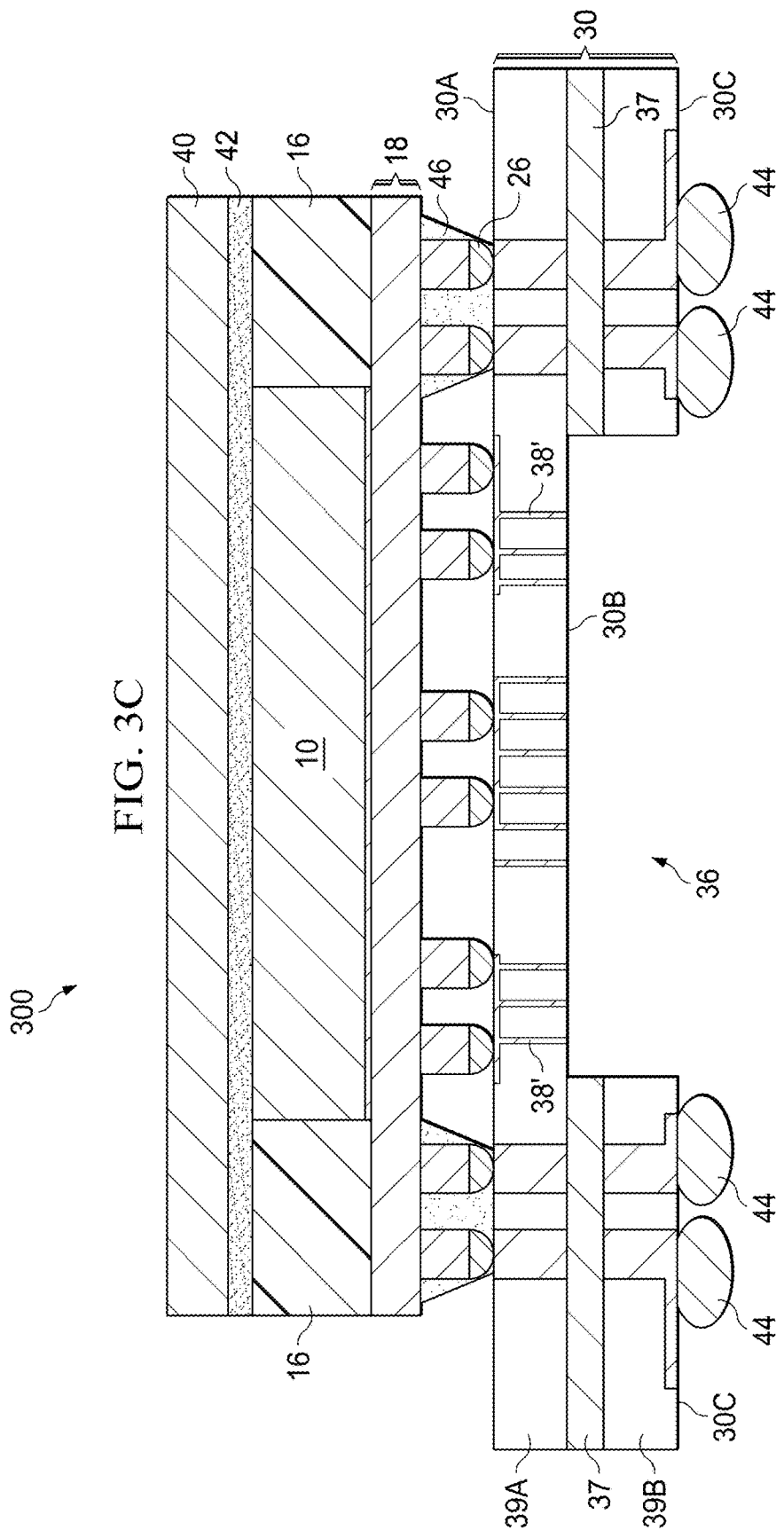

FIG. 3C illustrates the formation of various other features of package 300. For example, a reflow may be performed on connectors 26 and underfill 46 may be dispensed around connectors 26. Connectors 44 may be attached to surface 30C of package substrate 30 opposite die 10. Furthermore, a heat dissipation feature 40 may be disposed over die 10/molding compound 16. An interfacing material 42 (e.g., including a TIM and/or adhesive material) may be disposed between heat dissipation feature 40 and die 10/molding compound 16.

Figure 3D:
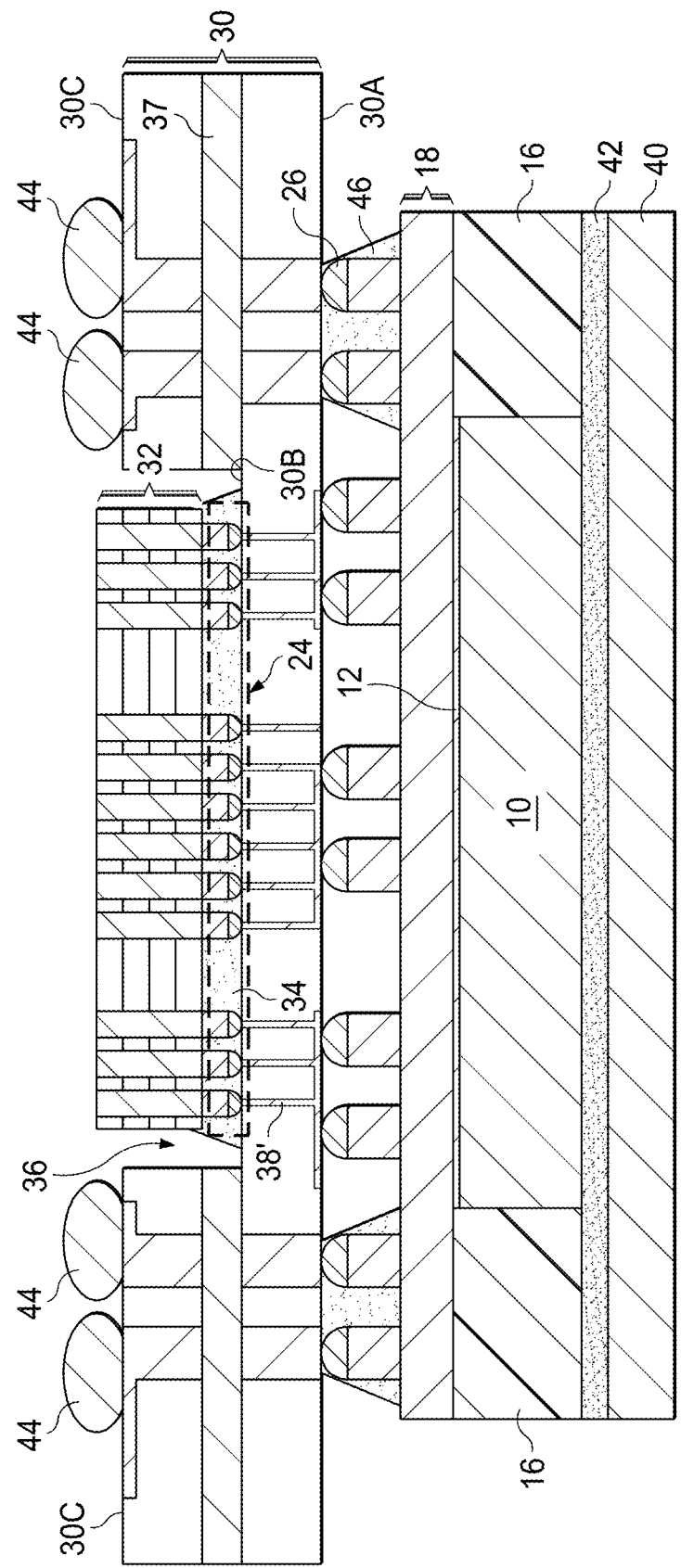
Figure 3E:
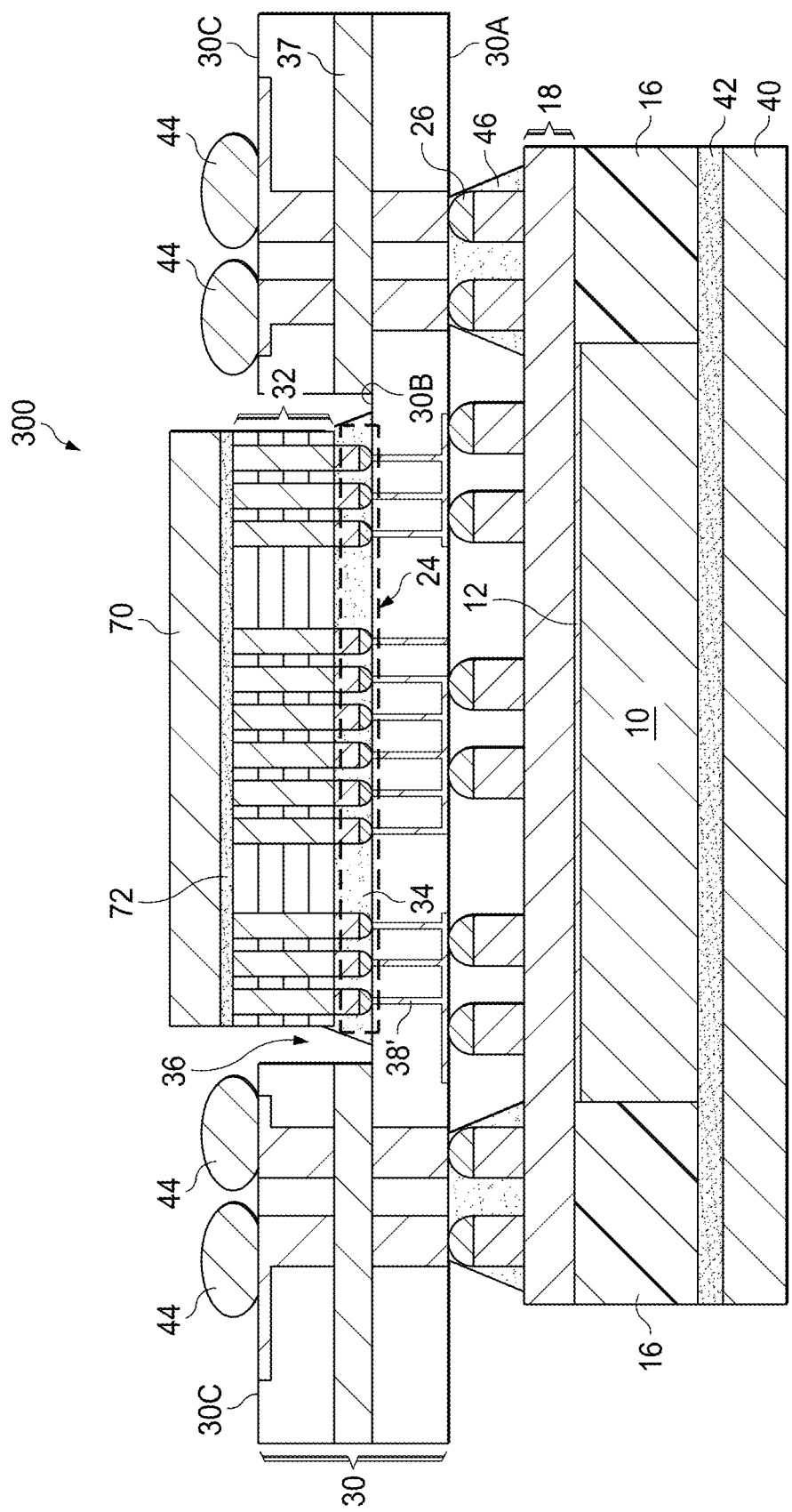

Subsequently, functional tests may be performed on package 300 prior to the attachment of dies 32. For example, electrical connections between die 10 and package substrate 30 may be tested. If package 300 passes the tests, dies 32 may be attached to package 300, for example, using connectors 24 formed as illustrated by FIG. 3D. Connectors 24 may be formed on dies 32 using any suitable method prior to attaching dies 32 to package 300. By performing functional tests on package 300 prior to the attachment of dies 32, dies 32 may be attached to only to known good packages. Packages that fail the functional tests may not have dies 32 attached thereto. Thus, cost savings may be incurred by avoiding attachment of dies 32 to failed packages.

Connectors 24 (e.g., microbumps) may be formed on dies 32 using any suitable method. Connectors 24 may be of a different size than connectors 26, and connectors 24 may be attached to contact pads on package substrate 30. Connectors 24 may be electrically connect dies 32 to die 10 through interconnect structures 38 in package substrate 30 (e.g., interconnect structures 38'), connectors 26, and RDLs 18.

Dies 32 may be disposed in cavity 36 of package substrate. In package 300, dies 32 and die 10 may be disposed on opposing sides of package substrate 30. Attaching dies 32 may include flipping package 300 (e.g., so that connectors 24 face upwards) and aligning dies 32 in cavity 36. A reflow may be performed on connectors 24 (e.g., to electrically connect dies 32 to die 10/package substrate 30), an underfill 34 may be dispensed around connectors 24.

The configuration of package 300 allows for a heat dissipation feature (e.g., heat dissipation feature 70) to be disposed on a surface dies 32. An interfacing material 72 may be disposed between heat dissipation feature 70 and dies 32, and interfacing material 72 may be in physical contact with dies 32. Heat dissipation feature 70 and interfacing material 72 may be substantially similar to heat dissipation feature 40 and interfacing material 42, respectively. Thus, an alternative manufacturing process may be used to form package 300.

Figure 5A:
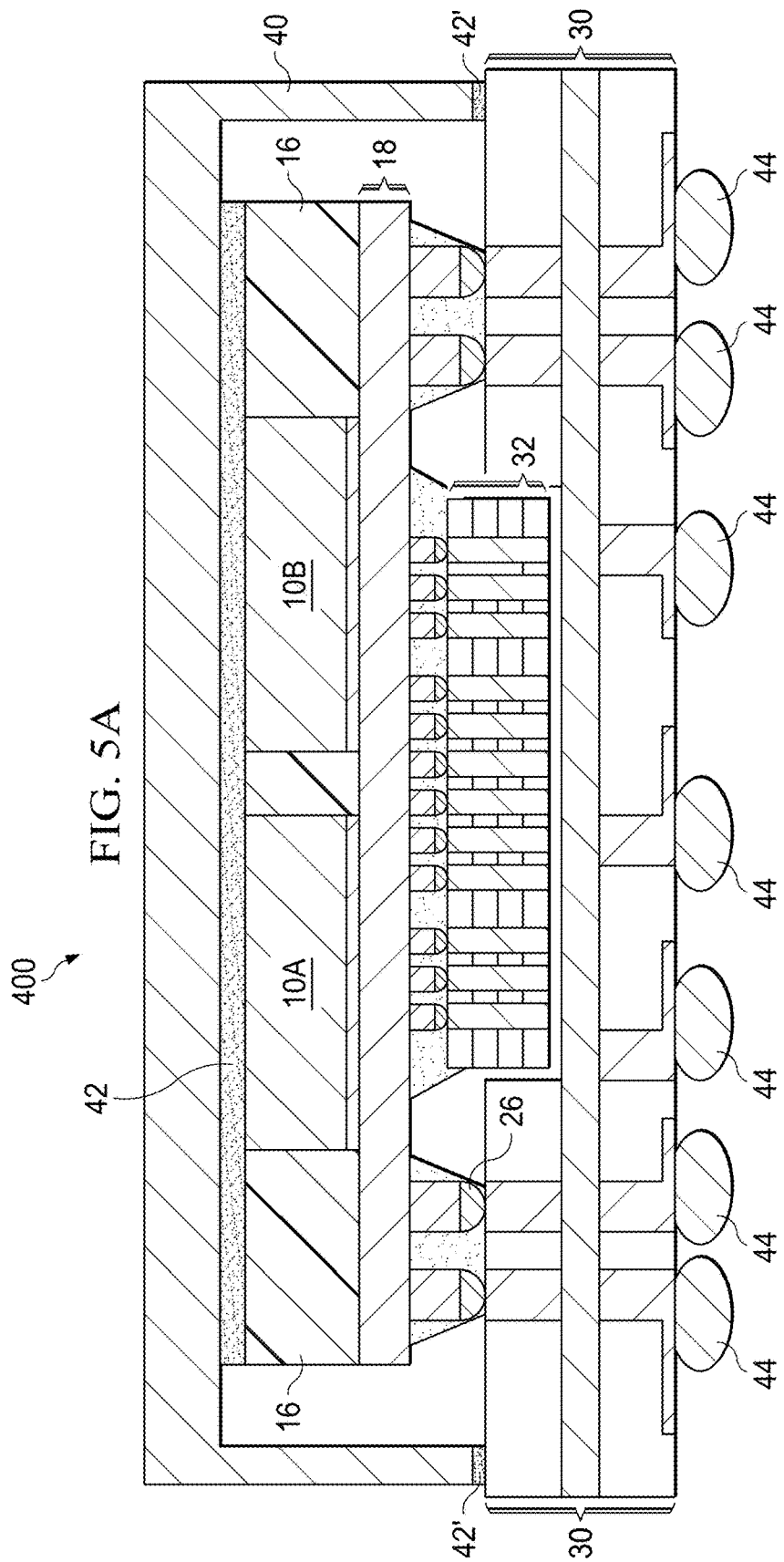
Figure 5B:
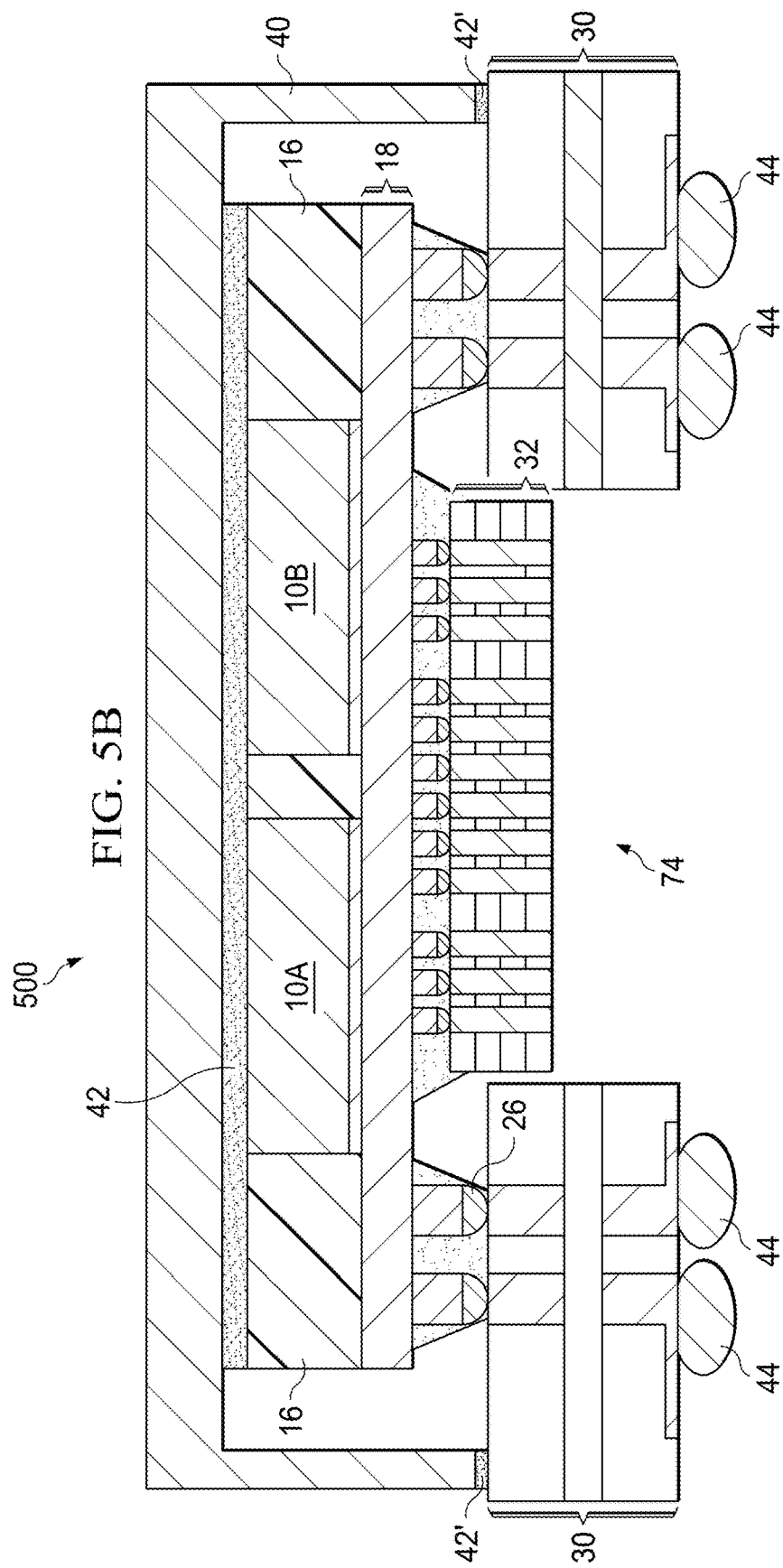

FIGS. 5A and 5B illustrate cross-sectional views of semiconductor packages 400 and 500, respectively. Packages 400 and 500 may be substantially similar to package 100 where like reference numerals represent like elements. However, packages 400 and 500 may further include multiple dies 10 (labeled 10A and 10B). Dies 10A and 10B may be part of a same fan-out package. For example, dies 10A and 10B may be surrounded by molding compound 16, and RDLs 18 may be formed on a surface of dies 10A and 10B. RDLs 18 may electrically connect dies 10A and 10B to dies 32. Furthermore, dies 10A and 10B may be substantially level. The formation of dies 10A and 10B may be substantially similar to the process illustrated in FIGS. 1A through 1J although singulation may be performed at different locations (e.g., scribe lines for a pick and place tool may be configured at different locations). In some embodiments, die 32 may be disposed in a cavity formed in substrate 30 (as illustrated by FIG. 5A). In other embodiments, die 32 may be disposed in a through-hole 74 in substrate 30 (as illustrated by FIG. 5B). Through hole 74 may be formed in substrate 30, for example, using a laser drilling process.

In alternative embodiments, package substrate 30 may be substantially free of any cavities or through holes. In such embodiments, a connector element (e.g., connector 26 or an interposer) may be used to bond the package substrate to die 10/RDLs 18. Such connector elements may have a suitable configuration and sufficient standoff height to accommodate dies 32 between die 10/RDLs 18 and package substrate 30. In such embodiments, the connector element may further be reinforced in order to provide structural support and reduce the risk of manufacturing defects (e.g., solder bridging). For example, in some embodiments, the connector element many include connectors 26 having elongated bump portions (e.g., conductive pillars), solder regions having a molded underfill (MUF) extending at least partially along sidewalls of solder regions, an interposer having conductive through vias and/or through holes, combinations thereof, and the like. FIGS. 6A through 11C illustrate varying semiconductor device packages according to such alternative embodiments.

Figures 6A, 6B:
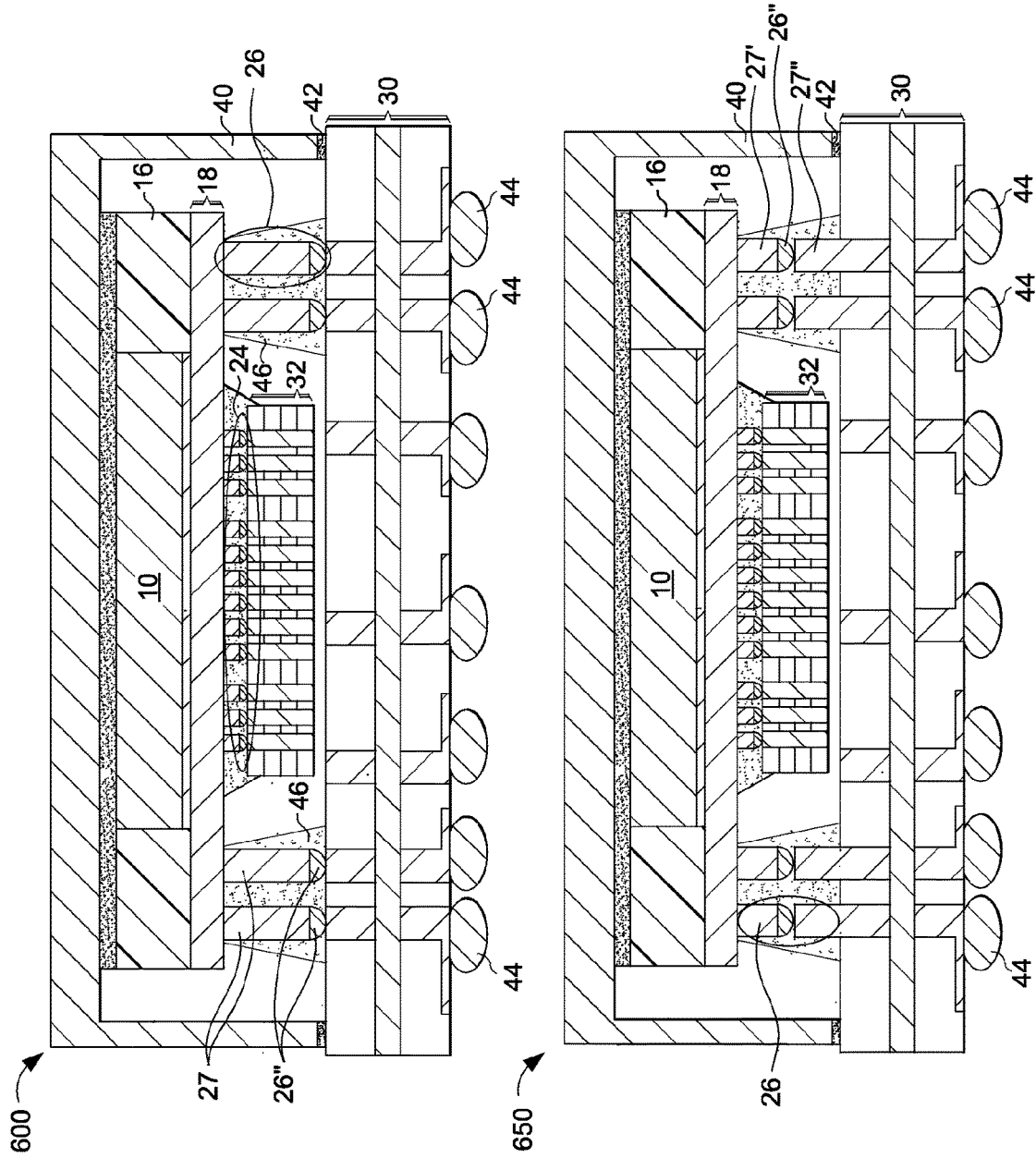

FIGS. 6A and 6B illustrate cross-sectional views of semiconductor device packages 600 and 650, respectively. Packages 600 and 650 may be substantially similar to package 100 where like reference numerals represent like elements. Package substrates 30 in packages 600 and 650 may not include any cavities or through holes disposed therein. Rather, both top and bottom surfaces of package substrate 30 may be substantially level.

In packages 600 and 650, dies 32 and package substrate 30 may be bonded to a same surface of RDLs 18, which electrically connects dies 32, package substrate 30, and die 10. In such embodiments, dies 32 may be disposed between RDLs 18 and package substrate 30. Connectors 26 (e.g., bonding RDLs 18 to package substrate 30) maybe elongated to provide a sufficient standoff height to accommodate the vertical dimension of dies 32. For example, connectors 26 may have a vertical dimension that is greater than the combined vertical dimensions of dies 32 and connectors 24 (used to bond dies 32 to RDLs 18).

Each connector 26 may comprise one or more conductive pillars 27 comprising copper, nickel, gold, aluminum, combinations thereof, and the like, for example. In some embodiments (e.g., as illustrated by FIG. 6A), each connector 26 may include a single conductive pillar 27 extending from a bottom surface of RDLs 18. A solder region 26" (e.g., a solder ball) may be disposed on conductive pillar 27, and solder region 26" may contact and electrically connect to a contact pad on package substrate 30. In other embodiments (e.g., as illustrated by FIG. 6B), each connector 26 may include a first conductive pillar 27' and a second conductive pillar 27". The first conductive pillar 27' extends from a bottom surface of RDLs 18. The second conductive pillar 27" extends from a top surface of package substrate 30. In such embodiments, solder ball 26" may be disposed between and contact the two conductive pillars 27' and 27". In packages 600 and 650, conductive pillars 27, 27', and 27" may be elongated and relatively large compared to solder region 26". For example, in FIG. 6A, each conductive pillar 27 (of package 600) may account for most (e.g., more than about 50%) of the vertical dimension of each respective connector 26. In such embodiments, conductive pillar 27 may have a greater vertical dimension than solder region 26". Furthermore, in FIG. 6B, each of the first and second conductive pillars 27' and 27" (of package 650) may account for at least about 20% to about 50% of the vertical dimension of each respective connector 26. In some embodiments, each conductive pillar 27 (in FIG. 6A) and conductive pillars 27' and 27" (in FIG. 6B) may have a vertical dimension of about 100 μm or more. By providing relatively large conductive pillars 27, the size of corresponding solder regions 26" may be reduced while still providing sufficient standoff height to accommodate dies 32. Such a configuration of connectors 26 may reduce the risk of manufacturing defects, such as solder bridging.

Figure 7:
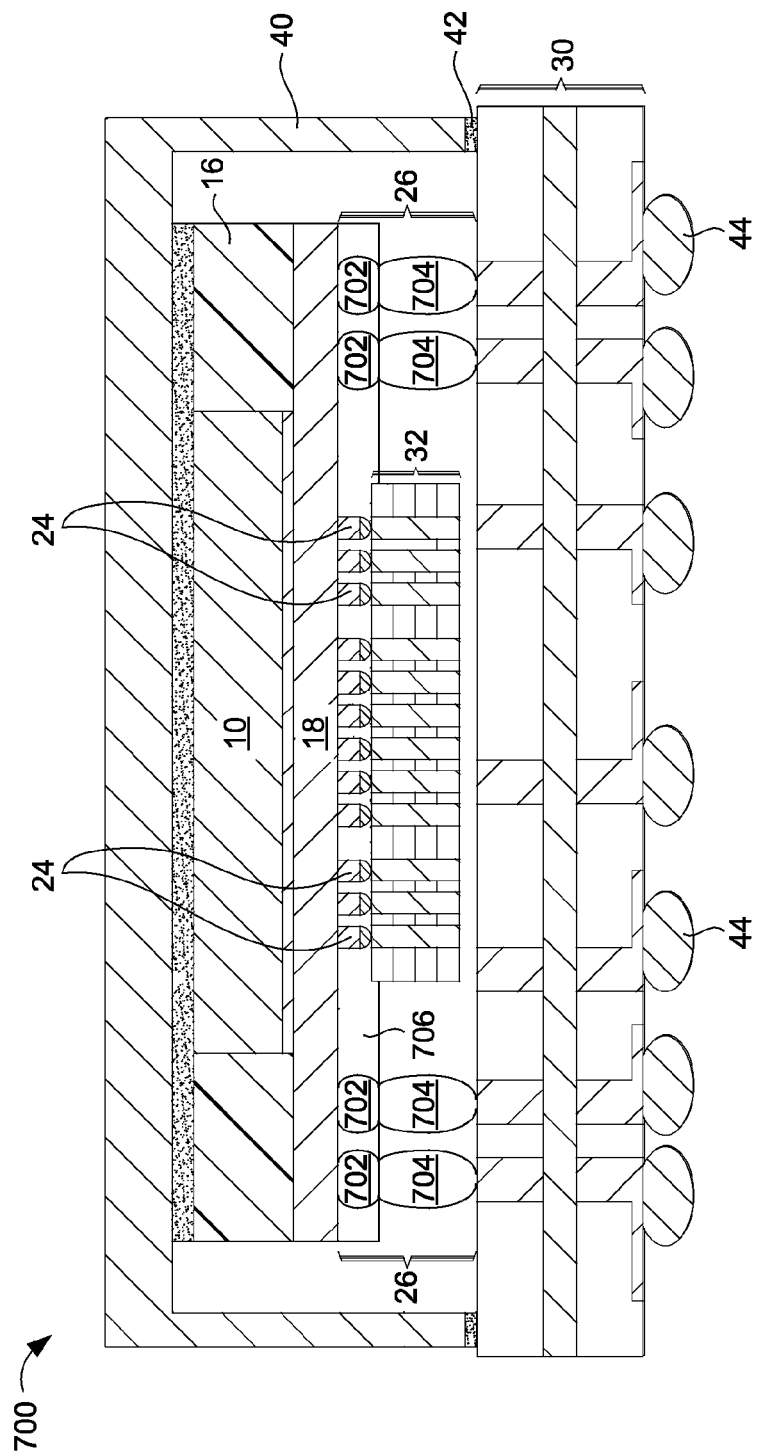

FIG. 7 illustrates a cross-sectional view of semiconductor device package 700. Package 700 may be substantially similar to package 600 or 650 where like reference numerals represent like elements. However, connectors 26 have an alternative configuration in package 700. For example, connectors 26 in package 700 may comprise solder regions 702 and 704, and such connectors 26 are used to bond a bottom surface of RDLs 18 to a top surface of package substrate 30. RDLs 18 may provide electrical connection between die 10 (e.g., a logic die), dies 32, and package substrate 30.

Similarly to packages 600 and 650, connectors 26 may have a vertical dimension that is sufficiently large to accommodate dies 32 between RDLs 18 and package substrate 30. In some embodiments, solder regions 702 and 704 may be two or more solder balls stacked vertically and reflowed to form connector 26. A molded underfill (MUF) 706 may be disposed (at least partially) around solder region 702 to provide structural support and reduce the risk of solder bridging during subsequent reflow processes. In some embodiments, MUF 706 may further be disposed around connectors 24 and may extend at least partially along sidewalls of dies 32.

Figure 8A:
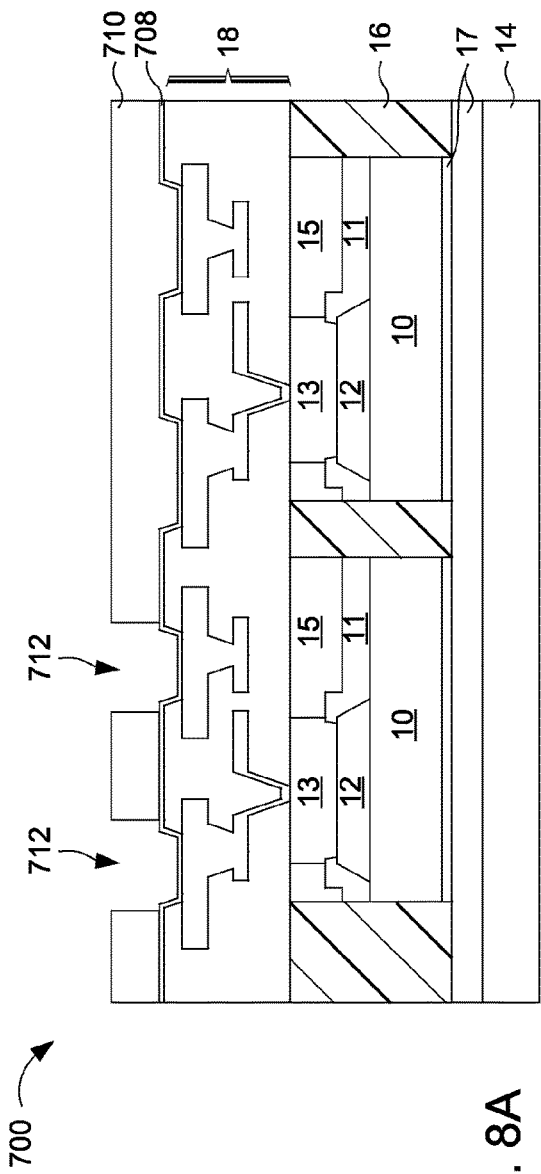

FIGS. 8A through 8H illustrate cross sectional views of intermediary steps of forming portions of package 700 (e.g., connectors 26 having solder regions 702 and 704) in accordance with some embodiments. Referring first to FIG. 8A, cross sectional views of dies 10 having fan-out RDLs 18 formed thereon is provided. Dies 10 may be semiconductor dies as described above having, for example, contact pads 12 and a first passivation layer 11 covering edges of contact pads 12. In the embodiments illustrated by FIGS. 8A through 8H, dies 10 may further include conductive pillars 13 (e.g., comprising copper and the like) extending through an opening in passivation layer 11 to electrically connect to contact pad 12. A second passivation layer 15 (e.g., comprising a polymer) may be formed over passivation layer 11 and around conductive pillar 13. Conductive features in RDLs 18 may be electrically connected to conductive pillar 13 and extend laterally past edges of dies 10. In other embodiments, conductive pillar 13/passivation layer 15 may be omitted, and conductive features in RDLs 18 may directly connect to contact pad 12. Furthermore, while FIG. 8A illustrates two dies 10, other embodiments may include any number of dies 10 depending on package design. Dies 10 may be attached to a carrier 14 (e.g., using adhesive layers 17), and a molding compound 16 may be formed around dies 10.

As further illustrated by FIG. 8A, a seed layer 708 may be formed over RDLs 18 using any suitable technique such as sputtering. Seed layer 708 may comprise a conductive material (e.g., copper) and may be electrically connected to conductive features in RDLs 18. A photoresist 710 is formed and patterned over seed layer 708 to include openings 712, which may expose portions of seed layer 708.

Figure 8B:
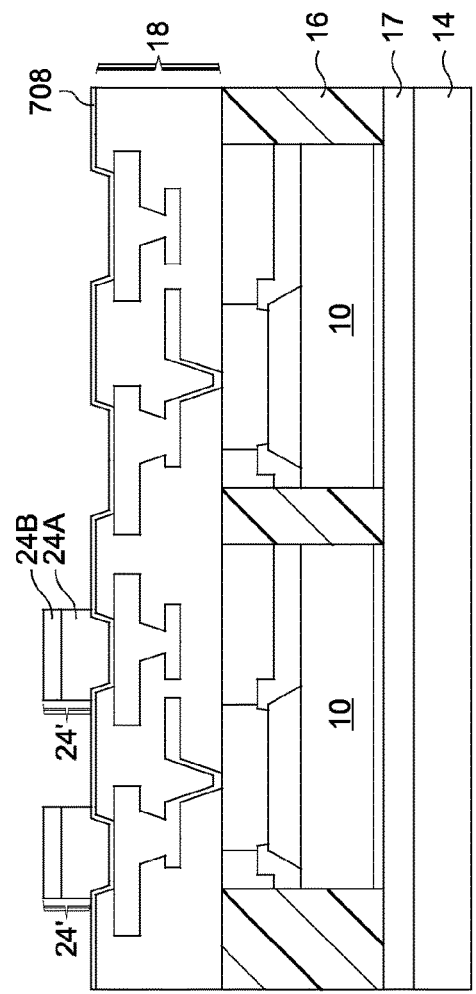

In FIG. 8B, connectors 24 (e.g., used to subsequently bond RDLs 18 to dies 32, not illustrated in FIG. 8B) are at least partially formed in openings 712. For example, connectors 24 may be microbumps formed in openings 712 using an electrochemical plating process. Connectors 24 may comprise multiple conductive layers. For example, in FIG. 8B, connectors 24 include a copper portion 24A and a nickel portion 24B over the copper portion. In such embodiments, the bottom conductive portion (e.g., copper portion 24A) may first be formed, a second seed layer may be deposited over the bottom conductive portion, and the top conductive portion (e.g., nickel portion 24B) may be formed using an electrochemical plating process, for example. Subsequently, a solder region (not shown) comprising tin and silver solder, for example, may be formed over nickel portion 24B. Alternatively, connectors 24 may include any number of conductive layers and/or other conductive materials may also be used. Subsequently, as also illustrated by FIG. 8B, photoresist 710 may be removed.

Figure 8C:
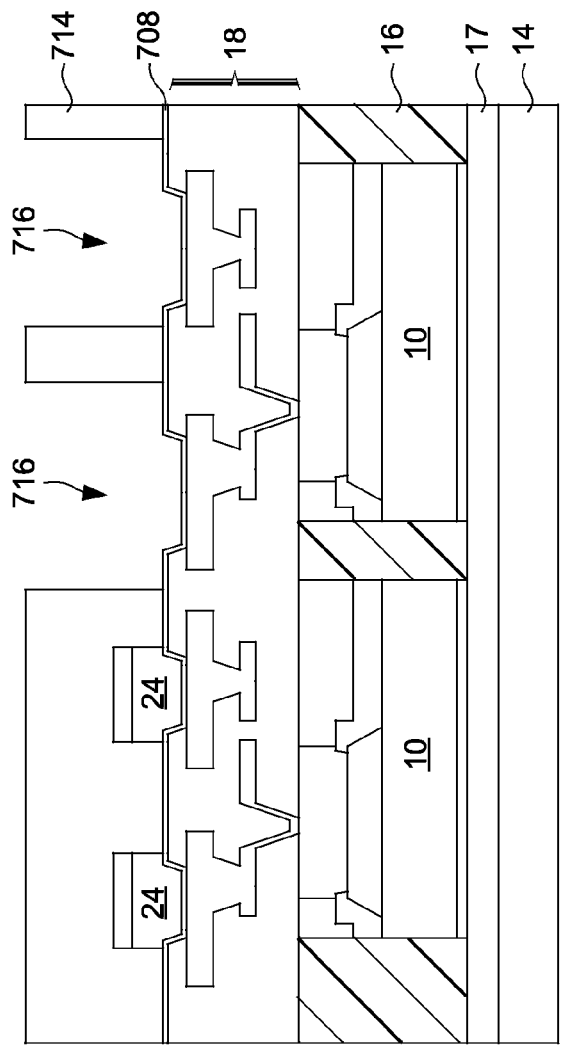
Figure 8D:
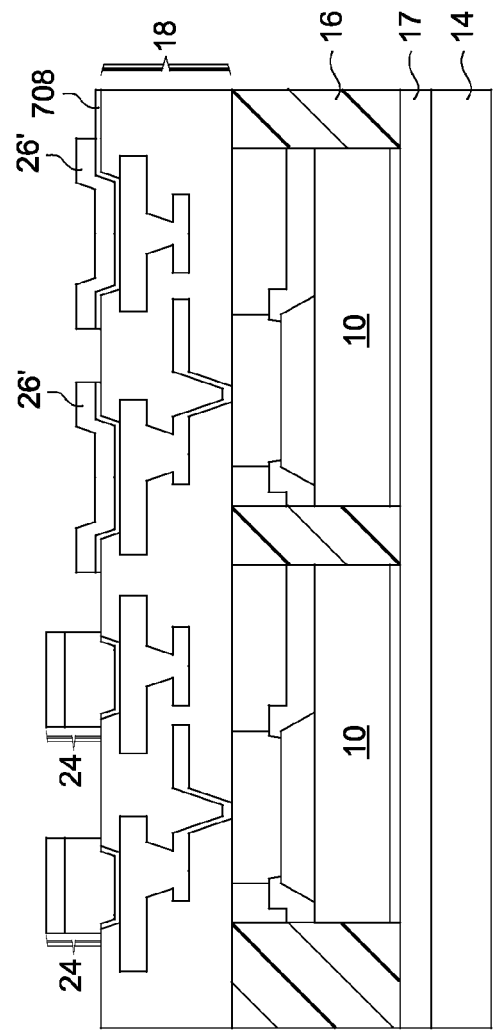

FIGS. 8C and 8D illustrate the formation of UBMs 26' for connectors 26. In FIG. 8C, a second photoresist 714 is formed over seed layer 708 and connectors 24. Photoresist 714 may mask over connectors 24, and photoresist 714 is patterned to include openings 716, which reveals portions of seed layer 708 previously masked by photoresist 710 (see FIG. 8A). Next, as illustrated by FIG. 8D, UBMs 26' are formed in openings 716 using an electrochemical plating process, for example. Photoresist 714 may then be removed.

In FIG. 8E, after the formation of connectors 24 and UBMs 26', seed layer 708 may be patterned using a combination of photolithography and/or etching processes, for example. The patterning of seed layer 708 may remove portions of seed layer 708 not covered by connectors 24 or UBMs 26'. As further illustrated by FIG. 8E, first solder regions 702 (e.g., a solder ball) are disposed on UBMs 26'.

In FIG. 8F, one or more dies 32 are attached to connectors 24, for example, using a reflow process. Connectors 24 electrically connect dies 32 to RDLs 18 (and die 10). Subsequently (as also illustrated by FIG. 8F), MUF 706 may be formed over seed layer 708 and RDLs 18. MUF 706 may further extend along sidewalls of dies 32 and solder region 702. In the illustrated embodiment, solder region 702 may extend over a top surface of MUF 706. The formation of MUF 706 may be done using any suitable process, such as compressive molding, transfer molding, liquid encapsulent molding, and the like. The illustrated configuration of MUF 706 may be achieved by controlling the amount of MUF material used, for example.

Figure 8G:
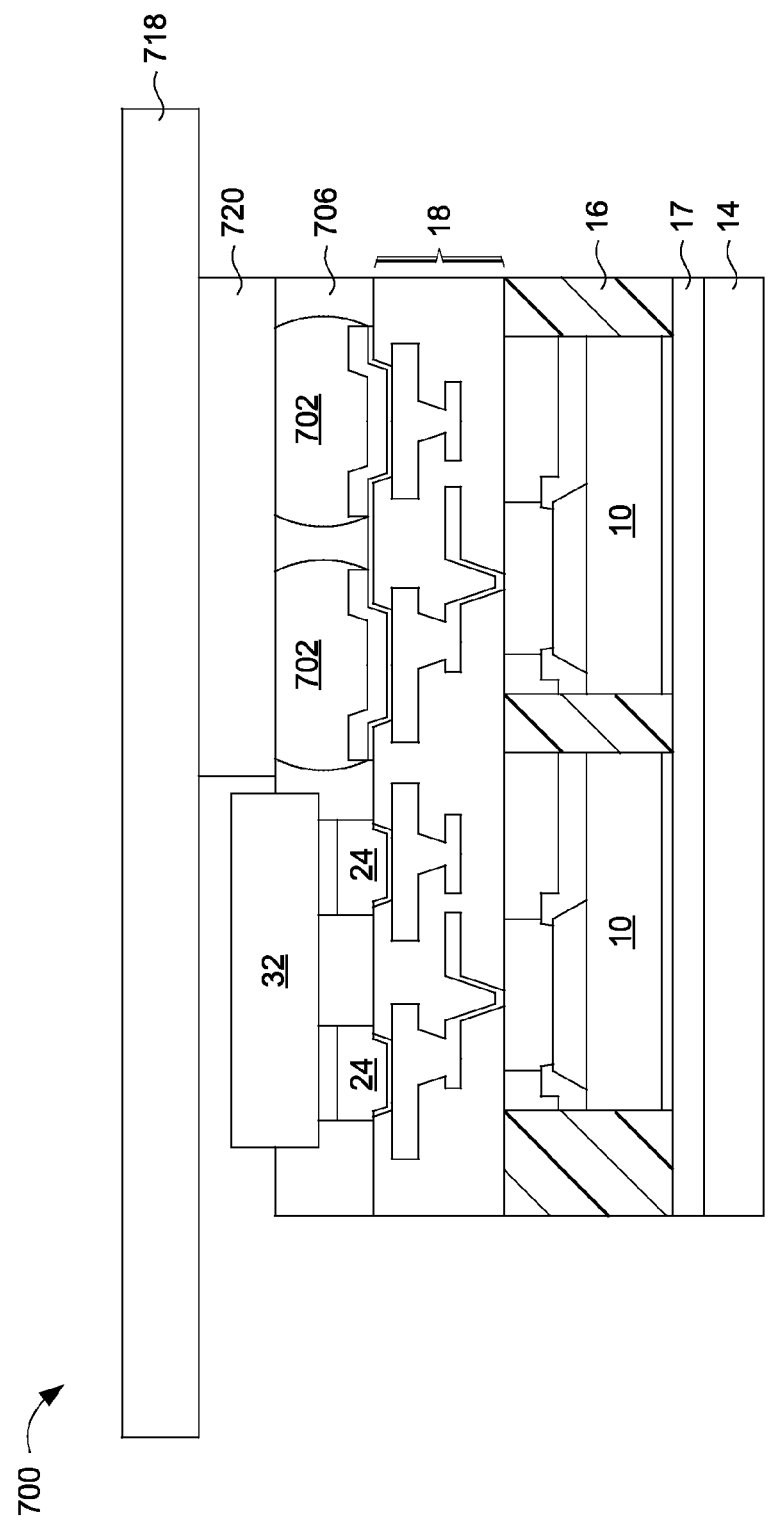

FIG. 8G illustrates the planarization of a top portion of solder region 702. After planarization, top surfaces of MUF 706 and solder region 702 may be substantially level. Solder region 702 may be planarized using any suitable process. For example, a coin head 718 may be operated to press rigid board 720 down, so that rigid board 720 presses and flattens the top surfaces of solder regions 702. The action of pressing and flattening the top surfaces of solder regions 702 is referred to as "coining" solder regions 702. In some embodiments, during the time period rigid board 720 is pressed, coin head 718 heats rigid board 720, which further heats solder regions 702. The resulting temperature of solder regions 702 is higher than the room temperature (about 21° C. to about 25° C., for example), and lower than the melting temperature of solder regions 702. In some embodiments, the temperature of solder regions 702 is between about 50° C. and about 150° C. during the coining process. In alternative embodiments, the heating of solder regions 702 is performed by heating package 700 from the bottom.

With the heating of solder regions 702, the required force needed to coin solder regions 702 is reduced. With the pressing-down of coin head 718, the height of solder regions 702 is reduced, and rigid board 720 is lowered, until rigid board 720 lands on MUF 706, at which time, the coining may be stopped. MUF 706 thus acts as the stopper of the coining. Furthermore, the thickness of MUF 706 defines the resulting height of solder regions 702. In alternative embodiments, rigid board 720 may not contact MUF 706, and coined, planar surface of solder region 702 may be higher than a top surface of MUF 706. Rigid board 720 and coin head 718 may then be removed. The use of a coining process may form a relatively flat top-surface for the subsequent formation of additional solder features on solder region 702. Alternatively, this coining process may be omitted.

Figure 8H:
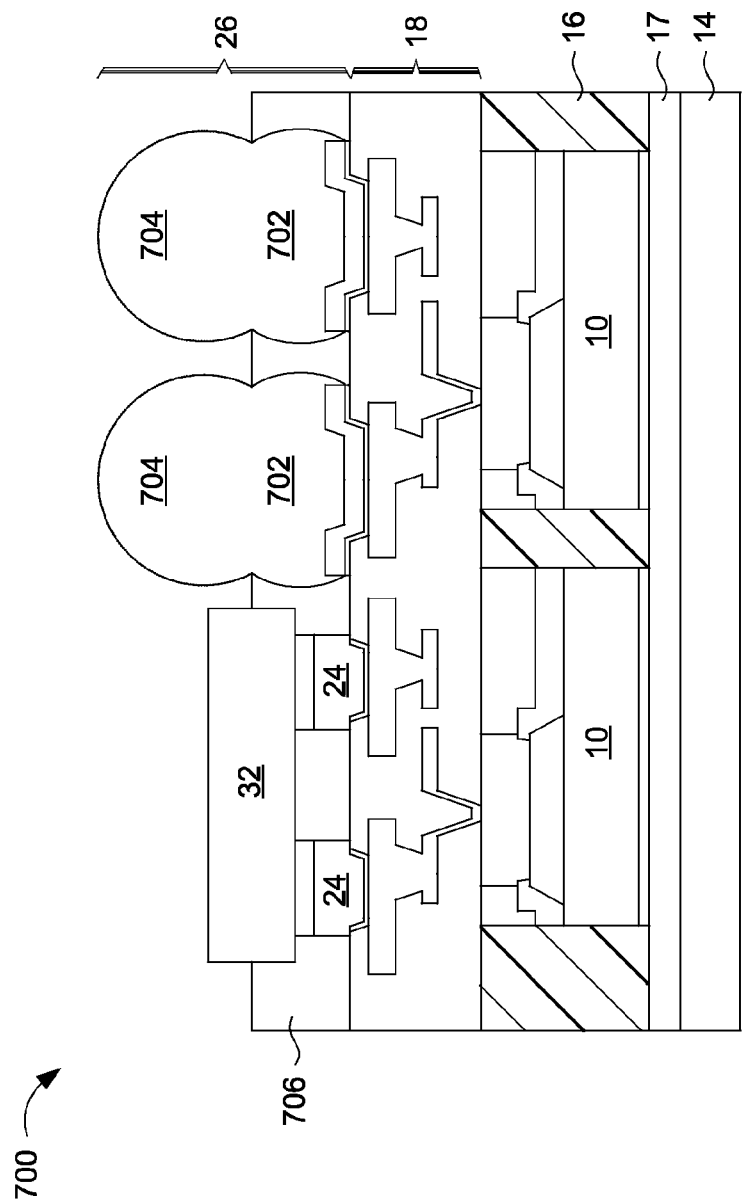

Next, as illustrated by FIG. 8H, solder region 704 (e.g., a second solder ball) is disposed on planarized solder region 702. Thus, connectors 26 are formed in package 700. In subsequent process steps, connectors 26 may be used to bond RDLs 18 to package substrate 30 (see e.g., FIG. 7). Each connector 26 includes UBM 26', a first solder region 702 (e.g., a coined solder ball), and a second solder region 704 (e.g., a second solder ball) over solder region 702. MUF 706 may be used to provide structural support and to reduce the risk of manufacturing defects, such as, solder bridging during subsequent reflow processes (e.g., during the bonding of package substrate 30).

FIGS. 9A through 9C illustrate varying views of intermediary stages of forming a semiconductor package 800 in accordance with alternative embodiments. Package 800 may be substantially similar to package 700 where like reference numerals represent like elements. However, as illustrated by the cross-sectional view of FIG. 9C, in package 800, connectors 26 may be replaced by an interposer 802, which is used to bond a bottom surface of RDLs 18 to a top surface of package substrate 30.

Referring to FIG. 9A, interposer 802 includes a substrate 804 having conductive vias 814 extending therethrough. Substrate 804 may comprise silicon and may or may not further comprise filler materials (e.g., e.g., silica filler, glass filler, aluminum oxide, silicon oxide, and the like). Conductive vias 814 may comprise copper, nickel, gold, aluminum combinations thereof, and the like, and conductive vias 814 may extend from a top surface to a bottom surface of substrate 804. Contact pads 806 (e.g., comprising a conductive material) may be formed on top and bottom surfaces of substrate 804 on conductive vias 814. In the illustrated embodiment, interposer 802 may be laminated to a bottom surface of RDLs 18 (as indicated by arrows 810), and contact pads 806 may be electrically connected to conductive features (not separately illustrated) in RDLs 18. Such conductive features may further provide electrical connection between interposer 802 and dies 10/32.

Interposer 802 may have a suitable configuration and vertical dimension to accommodate dies 32 between RDLs 18 and package substrate 30. For example, interposer 802 may include a through-hole extending therethrough as illustrated by the top down view of interposer 802 provided by FIG. 9B. When interposer 802 is bonded to RDLs 18, dies 32 may be (at least partially) disposed in through-hole 808. Subsequently, package substrate 30 may be bonded to a bottom surface of interposer 802 using connectors 812 (e.g., solder balls), which may be aligned with conductive vias 814. Interposer 802 and RDLs 18 may provide electrical connection between die 10 (e.g., a logic die), dies 32, and package substrate 30. Additional features (e.g., heat dissipation feature 40) may then be attached to package 800. The resulting package structure is illustrated in FIG. 9C.

Figure 10A:
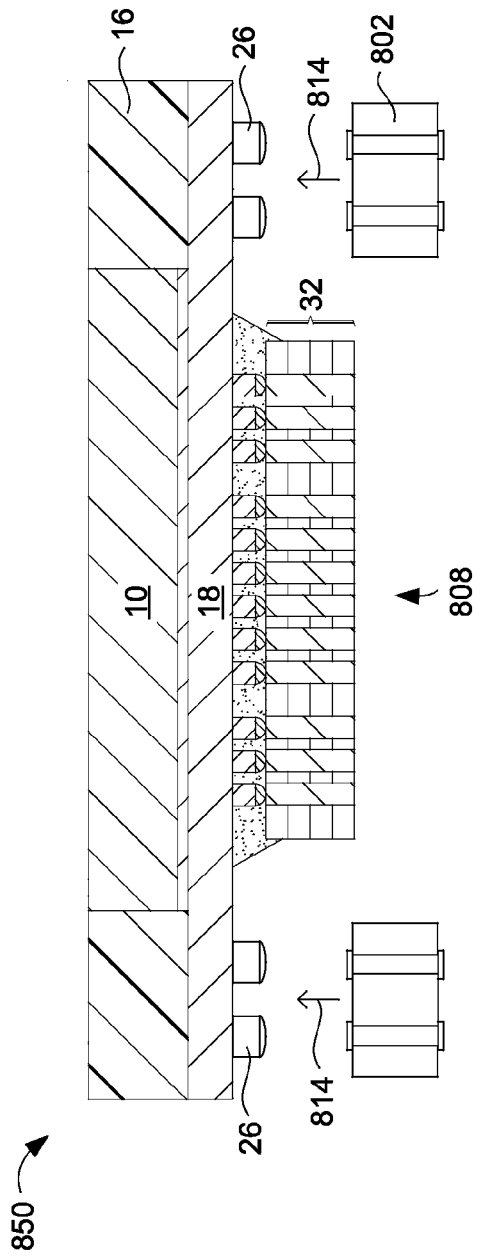
Figure 10B:
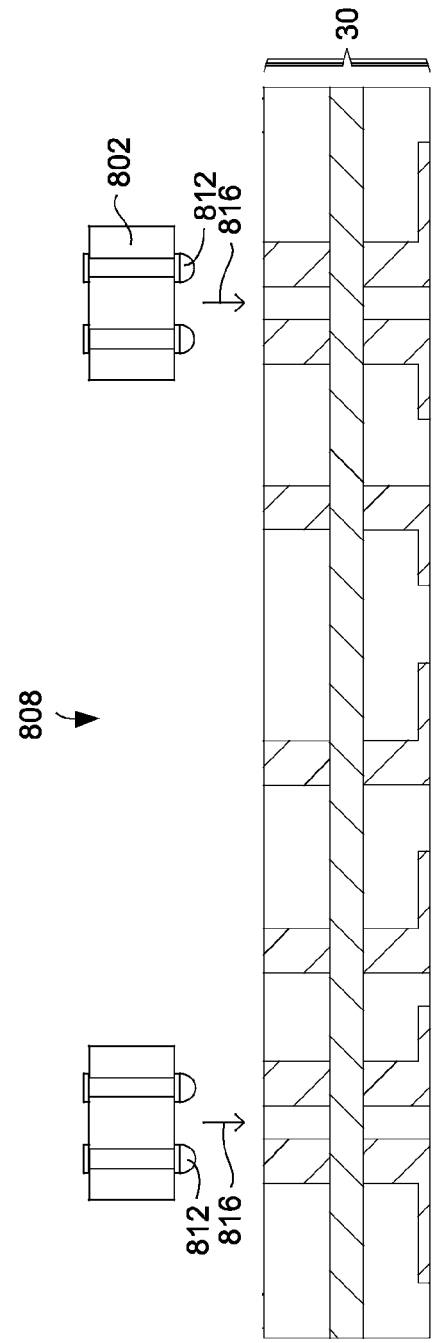
Figure 10C:
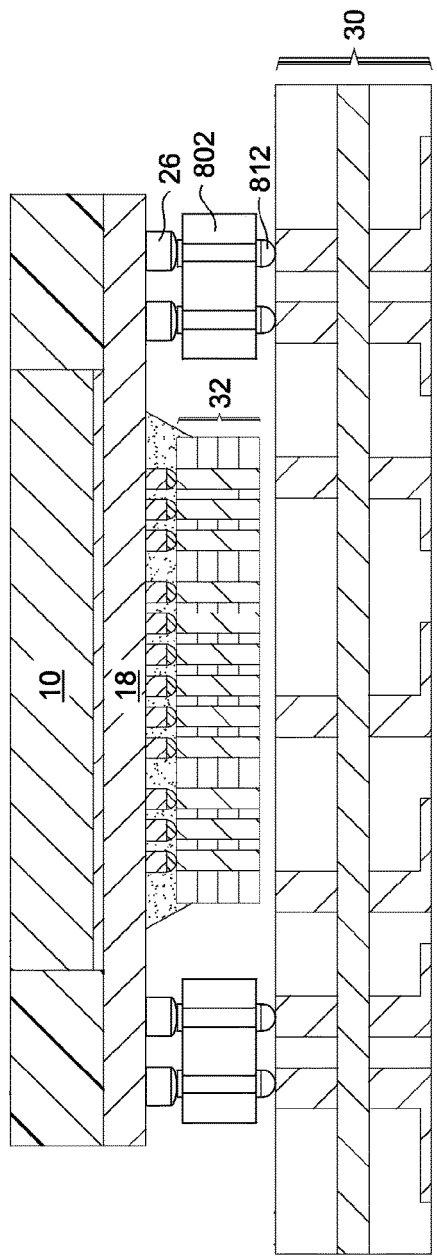
Figure 10D:
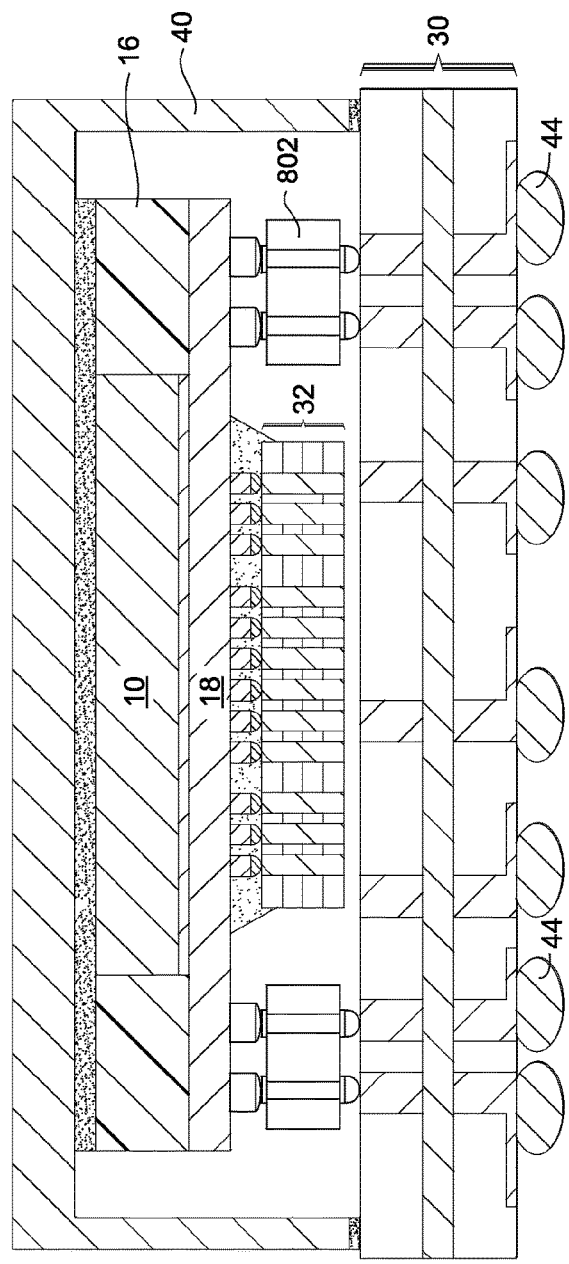

FIGS. 10A through 10D illustrate cross-sectional views of forming a semiconductor device package 850 according to alternative embodiments. Package 850 may be substantially similar to package 800 where like reference numerals represent like elements. In package 850, interposer 802 may be bonded to RDLs 18 by connectors 26 rather than laminated on RDLs 18. In some embodiments (e.g., as illustrated by FIG. 10A), interposer 802 may be bonded to RDLs 18 prior to the attachment of package substrate 30. In alternative embodiments (e.g., as illustrated by FIG. 10B), interposer 802 may be first bonded to package substrate 30 (e.g., using connectors 812 and/or a lamination process), and die 10/RDLs 18 are subsequently attached. FIG. 10C illustrates the bonded package 850 having die 10, RDLs 18, interposer 802, dies 32 disposed in through hole 808 of interposer 802, and package substrate 30. FIG. 10D illustrates the completed package 850 after the formation of additional features, such as, heat dissipation feature 40 and connectors 44.

Figure 11C:
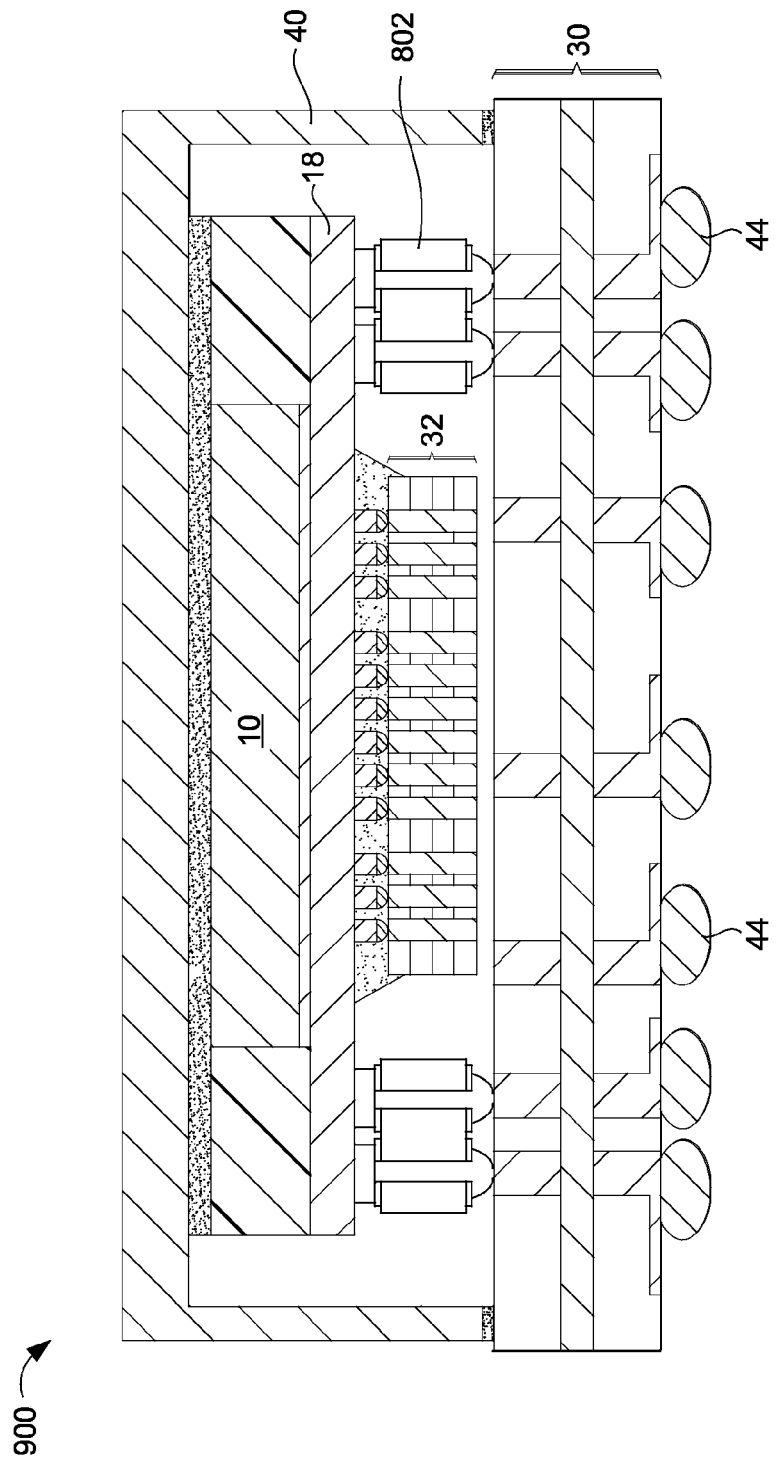

FIGS. 11A through 11C illustrate cross-sectional views of forming a semiconductor device package 900 according to alternative embodiments. Package 900 may be substantially similar to package 800 where like reference numerals represent like elements. In package 900, interposer 802 may not include conductive vias 814 (see FIG. 9A). Rather, at least a portion of connectors 26 may extend through openings 902 in interposer 802 to bond RDLs 18 to package substrate 30.

For example, referring to FIG. 11A, an interposer 802 is provided having through holes 902 extending through substrate 804. Also provided are connectors 26 disposed on a bottom surface of RDLs 18. Connectors 26 may include UBMs 26' and solder regions 26". In some embodiments, solder regions 26" may have a sufficient vertical dimension to extend through openings 902 in interposer 802. In FIG. 11B, interposer 802 is bonded to connectors 26 with solder regions 26" extending through substrate 804. Interposer 802 may be attached to solder regions 26" using a reflow process, for example. In some embodiments, solder regions 26" may further extend past a bottom surface of interposer 802. Furthermore, contact pads 806 may be electrically connected to connectors 26. Connectors 26 bonds interposer 802 to RDLs 18, and dies 32 may be disposed in a through hole 808 of interposer 802. Subsequently, as illustrated by FIG. 11C, connectors 26 are used to bond RDLs 18 to a package substrate 30. FIG. 11C further illustrates the completed package 900 after the formation of additional features, such as, heat dissipation feature 40 and connectors 44.

Figure 12:
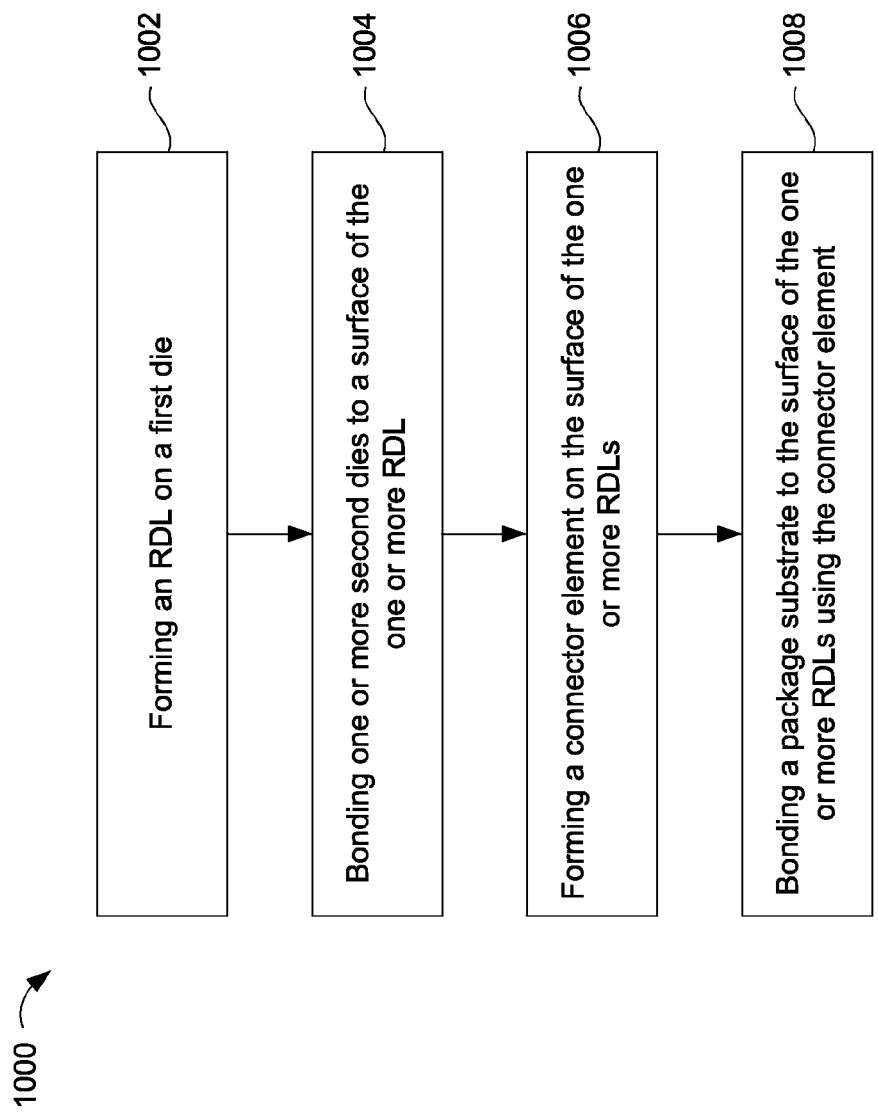

FIG. 12 illustrates a process flow 1000 of a method for forming a semiconductor device package in accordance with some embodiments. In step 1002, one or more RDLs (e.g., RDLs 18) are formed on a surface of a first die (e.g., die 10). The one or more RDLs may extend laterally past edges of the first die (e.g., over a molding compound), and thus such RDLs may also be referred to as fan-out RDLs. Next, in step 1004, one or more second dies (e.g., dies 32) are bonded to a surface of the one or more RDLs opposing the first die.

In step 1006, a connector element is formed on the surface of the one or more RDLs. In some embodiments, the connector element may be connector 26 having, for example, a one or more conductive pillars and a solder region disposed on the conductive pillars (e.g., as illustrated by FIGS. 6A and 6B). In other embodiments, the solder region may be disposed on an UBM, and a molded underfill may further extend at least partially along sidewalls of the solder region (e.g., as illustrated by FIG. 7). In yet other embodiments, the connector element may include an interposer (e.g., interposer 802), which may include a through hole (e.g., through hole 808). In such embodiments, the one or more second dies may be disposed at least partially in the through hole. In step 1008, a package substrate (e.g., package substrate 30) is bonded to the surface of the one or more RDLs using the connector element. In some embodiments, the package substrate and the one or more second dies are bonded to a same surface of the one or more RDLs, and the one or more second dies may be disposed between the package substrate and the one or more RDLs. In order to accommodate this configuration, in such embodiments, the connector element may have a greater vertical dimension than the one or more second dies.

Thus, as described above, a package substrate may include a cavity. A first die may be bonded to the package substrate. Where the cavity may be on the same side of the package substrate as the first die or on an opposing side of the package substrate as the first die. One or more second dies may be bonded to the package substrate and the first die, and the second dies may be disposed in the cavity. The second die may be bonded directly to the first die, or the second die may be bonded directly to the package substrate. In other embodiments, the package substrate may be substantially free of any cavities, and the second dies may be disposed between the first die and the package substrate. Connector elements bonding the first die to the package substrate may be elongated to provide sufficient standoff height to accommodate the second dies. Thus, the configuration of the package substrate allows for a package having a relatively thin form factor. Furthermore, the configuration of the dies in the package may allow for relatively simplistic heat dissipation elements to be attached to at least the first die.

In accordance with an embodiment, a device package includes first die and one or more redistribution layers (RDLs) electrically connected to the first die. The one or more RDLs extend laterally past edges of the first die. The device package further includes one or more second dies bonded to a first surface of the one or more RDLs and a connector element on the first surface of the one or more RDLs. The connector element has a vertical dimension greater than the one or more second dies. A package substrate is bonded to the one or more RDLs using the connector element, wherein the one or more second dies is disposed between the first die and the package substrate.

In accordance with another embodiment, a device package includes a first die, molding compound extending along sidewalls of the first die, and one or more redistribution layers (RDLs) on the first die and the molding compound. The device package further includes a plurality of second dies bonded to a surface of the one or more RDLs opposing the first die and the molding compound. A connector element is disposed on the surface of the one or more RDLs. The connector element bonds a package substrate to the one or more RDLs, and the plurality of second dies is disposed between the one or more RDLs and the package substrate. The device package further includes a heat dissipation feature on an opposing surface of the first die as the one or more RDLs.

In accordance with yet another embodiment, a method for forming a device package includes forming one or more redistribution layers (RDLs) on a first die and bonding one or more second dies to a surface of the one or more RDLs opposing the first die. The one or more RDLs extend laterally past edges of the first die. The method further includes forming a connector element on the surface of the one or more RDLs and bonding a package substrate to the surface of the one or more RDLs using the connector element. The connector element has a first vertical dimension greater than a second vertical dimension of the one or more second dies, and the one or more second dies are disposed between the one or more RDLs and the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device package comprising:
a first die;
one or more redistribution layers (RDLs) electrically connected to the first die, wherein the one or more RDLs extend laterally past edges of the first die;
one or more second dies bonded to a first surface of the one or more RDLs;
a connector element on the first surface of the one or more RDLs, wherein a vertical dimension of the connector element is greater than a vertical dimension of the one or more second dies, wherein the connector element comprises:
a first portion on the first surface of the one or more RDLs, the first portion accounting for 20% to 50% of the vertical dimension of the connector element;
a second portion disposed on the first portion, the second portion being a different material than the first portion; and
a third portion disposed on the second portion, the third portion being a different material than the second portion, the third portion accounting for 20% to 50% of the vertical dimension of the connector element, the first portion, the second portion, and the third portion accounting for 100% of the vertical dimension of the connector element; and
a package substrate bonded to the one or more RDLs using the connector element, wherein the one or more second dies is disposed between the first die and the package substrate, wherein the third portion of the connector element disposed on a first surface of the package substrate.

2. The device package of claim 1, wherein:
the first portion comprises a first conductive pillar; and
the second portion comprises a solder region on the first conductive pillar.

3. The device package of claim 2, wherein the third portion comprises a second conductive pillar on the solder region.

4. The device package of claim 2, wherein a vertical dimension of the first conductive pillar is greater than a vertical dimension of the solder region.

5. The device package of claim 1, further comprising a molded underfill surrounding the connector element.

6. The device package of claim 5, wherein the molded underfill extends at least partially along the first surface of the package substrate and the first surface of the one or more RDLs.

7. The device package of claim 1, further comprising a heat dissipation feature over the first die.

8. The device package of claim 1, further comprising a molding compound extending along sidewalls of the first die and a second surface of the one or more RDLs, the second surface of the one or more RDLs opposite the first surface of the one or more RDLs.

9. The device package of claim 1, wherein a combined vertical dimension of the first portion of the connector element and the second portion of the connector element is about 100 µm.

10. A device package comprising:
a first die;
a molding compound extending along sidewalls of the first die;
one or more redistribution layers (RDLs) on the first die and the molding compound;
a plurality of second dies bonded to a surface of the one or more RDLs opposing the first die and the molding compound, the plurality of second dies having a first vertical dimension;

a connector element on the surface of the one or more RDLs, wherein the connector element bonds a package substrate to the one or more RDLs, wherein the plurality of second dies is disposed between the one or more RDLs and the package substrate, wherein the connector element has a second vertical dimension greater than the first vertical dimension, wherein the connector element comprises:
  a first conductive pillar extending from the surface of the one or more RDLs, the first conductive pillar accounting for 20% to 50% of the second vertical dimension;
  a second conductive pillar extending from a surface of the package substrate facing the surface of the one or more RDLs, the second conductive pillar accounting for 20% to 50% of the second vertical dimension; and
  a solder region bonding the first conductive pillar to the second conductive pillar, the solder region being a different material than the first conductive pillar and the second conductive pillar, the first conductive pillar, the second conductive pillar, and the solder region accounting for 100% of the second vertical dimension; and
a heat dissipation feature on an opposing surface of the first die as the one or more RDLs.

11. The device package of claim 10, wherein the first conductive pillar has a height greater than the solder region.

12. The device package of claim 10, further comprising a molded underfill surrounding the connector element.

13. The device package of claim 10, wherein a combined vertical dimension of the first conductive pillar and the second conductive pillar is about 100 µm.

14. A method for forming a device package comprising:
  forming one or more redistribution layers (RDLs) on a first die, wherein the one or more RDLs extend laterally past edges of the first die;
  bonding one or more second dies to a surface of the one or more RDLs opposing the first die;
  forming a first conductive pillar on the surface of the one or more RDLs;
  forming a second conductive pillar on a surface of a package substrate; and
  bonding the first conductive pillar to the second conductive pillar using a solder region, a vertical dimension of each of the first and second conductive pillar being from 20% to 50% of a combined vertical dimension of the first conductive pillar, the second conductive pillar, and the solder region, wherein the one or more second dies are disposed between the one or more RDLs and the package substrate after the bonding.

15. The method of claim 14, wherein bonding the first conductive pillar to the second conductive pillar comprises:
  forming the solder region on the first conductive pillar.

16. The method of claim 15, wherein bonding the first conductive pillar to the second conductive pillar further comprises:
  forming the second conductive pillar on the package substrate; and
  reflowing the solder region to the second conductive pillar.

17. The method of claim 14, further comprising forming a molded underfill surrounding the first conductive pillar and the second conductive pillar.

18. The method of claim 14, further comprising forming a heat dissipation feature over the first die and contacting the package substrate.

19. The method of claim 14, wherein forming the one or more RDLs on the first die comprises forming a molding compound extending along sidewalls of the first die and along a surface of the one or more RDLs facing the first die.

20. The method of claim 14, wherein a combined vertical dimension of the first conductive pillar and the second conductive pillar is about 100 µm.

* * * * *